US011677162B2

(12) United States Patent
Lee et al.

(10) Patent No.: US 11,677,162 B2
(45) Date of Patent: Jun. 13, 2023

(54) ELECTRONIC DEVICE FOR IDENTIFYING PERFORMANCE OF COMMUNICATION CIRCUIT BASED ON SIGNAL TRANSMITTED AND RECEIVED VIA ANTENNA

(71) Applicant: Samsung Electronics Co., Ltd., Suwon-si (KR)

(72) Inventors: Chaejun Lee, Suwon-si (KR); Jihoon Kim, Suwon-si (KR); Jiyong Kim, Suwon-si (KR); Hyoseok Na, Suwon-si (KR); Jongin Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 17 days.

(21) Appl. No.: 17/532,208

(22) Filed: Nov. 22, 2021

(65) Prior Publication Data

US 2022/0085517 A1  Mar. 17, 2022

Related U.S. Application Data

(63) Continuation of application No. 16/876,716, filed on May 18, 2020, now Pat. No. 11,189,937, which is a
(Continued)

(30) Foreign Application Priority Data

Dec. 4, 2018 (KR) .................. 10-2018-0154652

(51) Int. Cl.
*H01Q 1/24* (2006.01)
*H01Q 21/06* (2006.01)
(Continued)

(52) U.S. Cl.
CPC ........... *H01Q 21/065* (2013.01); *H01Q 1/243* (2013.01); *H01Q 9/0414* (2013.01);
(Continued)

(58) Field of Classification Search
CPC .......... H01Q 1/24; H01Q 1/243; H01Q 21/06; H01Q 21/065; H01Q 9/04; H01Q 9/0414;
(Continued)

(56) References Cited

U.S. PATENT DOCUMENTS 7,746,290 B2 * 6/2010 Skarp ..................... H01Q 1/243
343/702
8,045,926 B2  10/2011 Martikkala et al.
(Continued)

FOREIGN PATENT DOCUMENTS

CN   106797221 A   5/2017
CN   208257803 A   12/2018
(Continued)

OTHER PUBLICATIONS

International Search Report issued in International Application No. PCT/KR2019/016957 dated Mar. 10, 2020.
(Continued)

*Primary Examiner* — Tho G Phan
(74) *Attorney, Agent, or Firm* — Jefferson IP Law, LLP

(57) ABSTRACT

An electronic device is provided The electronic device includes a patch antenna element, at least one antenna including a first feeding unit electrically connected to the patch antenna element and a second feeding unit electrically connected to the patch antenna element so as to have a designated isolation for a signal that is input to the first feeding unit, a radio frequency integrated circuit (RFIC) which includes a first communication circuit including a first transmission circuit and a first reception circuit which are electrically connected to the first feeding unit, and a second communication circuit including a second transmission circuit and a second reception circuit which are electrically connected to the second feeding unit, and a processor.

22 Claims, 14 Drawing Sheets

Related U.S. Application Data continuation of application No. 16/702,000, filed on Dec. 3, 2019, now Pat. No. 11,329,395.

(51) Int. Cl.
  *H04B 17/318* (2015.01)
  *H01Q 9/04* (2006.01)
  *H03F 3/195* (2006.01)

(52) U.S. Cl.
  CPC ......... *H01Q 9/0435* (2013.01); *H01Q 9/0442* (2013.01); *H03F 3/195* (2013.01); *H04B 17/318* (2015.01); *H03F 2200/421* (2013.01); *H03F 2200/451* (2013.01)

(58) Field of Classification Search
  CPC .. H01Q 9/0428; H01Q 9/0435; H01Q 9/0442; H03F 3/195; H04B 17/318; H04B 1/48; H04B 17/14
  See application file for complete search history.

(56) References Cited

U.S. PATENT DOCUMENTS

| | | | |
|---|---|---|---|
| 8,325,084 | B2 | 12/2012 | Walker |
| 9,602,149 | B1* | 3/2017 | Tanzi .................... H04L 5/1461 |
| 9,628,203 | B2 | 4/2017 | Weissman et al. |
| 9,673,916 | B2 | 6/2017 | Mow et al. |
| 9,893,820 | B2 | 2/2018 | Nardozza |
| 10,075,202 | B2 | 9/2018 | Wu et al. |
| 10,419,749 | B2* | 9/2019 | Roe .......................... H01Q 9/14 |
| 11,139,558 | B2* | 10/2021 | Cho ...................... H01Q 1/243 |
| 11,444,706 | B2* | 9/2022 | Yang ..................... H04B 17/29 |
| 2008/0012748 | A1 | 1/2008 | Ahn |
| 2010/0093282 | A1 | 4/2010 | Martikkala et al. |
| 2013/0072125 | A1 | 3/2013 | Yoon et al. |
| 2013/0072136 | A1 | 3/2013 | Besoli et al. |
| 2014/0120968 | A1 | 5/2014 | Mahmood |
| 2016/0020738 | A1 | 1/2016 | Lee et al. |
| 2016/0099733 | A1 | 4/2016 | Weissman et al. |
| 2017/0279479 | A1 | 9/2017 | Adams et al. |
| 2017/0325109 | A1 | 11/2017 | Cummings |
| 2018/0081775 | A1 | 3/2018 | Powell et al. |
| 2018/0358686 | A1 | 12/2018 | Park |
| 2020/0091608 | A1 | 3/2020 | Alpman et al. |
| 2022/0085517 | A1* | 3/2022 | Lee ...................... H01Q 9/0442 |
| 2023/0008159 | A1* | 1/2023 | Brogle .................... H04B 1/48 |

FOREIGN PATENT DOCUMENTS

| | | |
|---|---|---|
| KR | 10-2008-0006155 A | 1/2008 |
| KR | 10-2012-0012563 A | 2/2012 |
| KR | 10-2016-0009230 A | 1/2016 |
| WO | 2018/119153 A2 | 6/2018 |

OTHER PUBLICATIONS

Written Opinion of the International Searching Authority issued in International Application No. PCT/KR2019/016957 dated Mar. 10, 2020.

Extended European Search Report issued in European Application No. 19213421.1-1220 dated Apr. 29, 2020.

Chinese Office Action issued in Chinese Application No. 201911228490.X dated Mar. 18, 2021.

\* cited by examiner

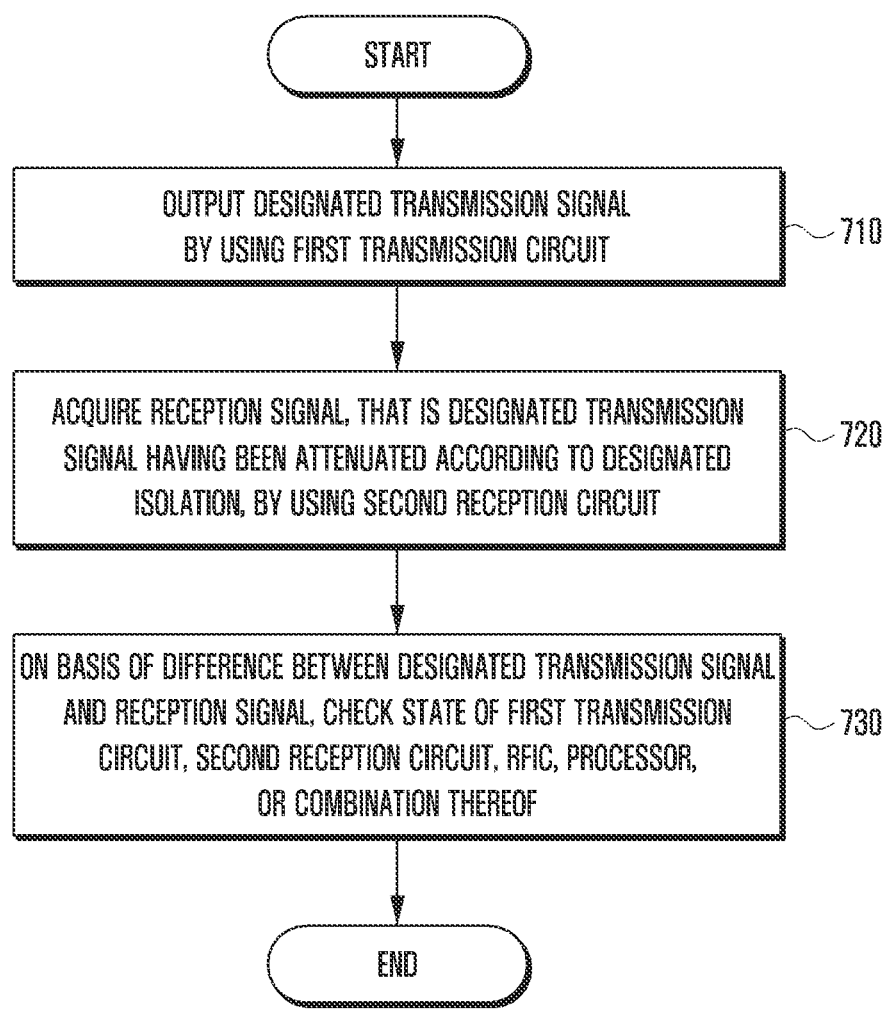

ELECTRONIC DEVICE FOR IDENTIFYING PERFORMANCE OF COMMUNICATION CIRCUIT BASED ON SIGNAL TRANSMITTED AND RECEIVED VIA ANTENNA

CROSS-REFERENCE TO RELATED APPLICATION(S)

This application is a continuation of prior application Ser. No. 16/876,716 filed on May 18, 2020, which has issued as U.S. Pat. No. 11,189,937 on Nov. 30, 2021; which is a continuation of prior application Ser. No. 16/702,000 filed on Dec. 3, 2019; which is based on and claims priority under 35 U.S.C. 119(a) of a Korean patent application number 10-2018-0154652 filed on Dec. 4, 2018, in the Korean Intellectual Property Office, the entire disclosure of each of which is incorporated by reference herein in its entirety.

BACKGROUND

1. Field

The disclosure generally relates to electronic devices, and more particularly, to an electronic device capable of identifying the performance of a communication circuit based on a signal transmitted and received via an antenna.

2. Description of Related Art

Various types of electronic devices, such as mobile terminals, smart phones, tablets, personal computers (PCs), notebooks, wearable devices, digital cameras, or Internet of Things (IoT) devices, are widely used.

With the recent development of wireless communication technology, wireless communication circuits supporting wireless communication in ultra-high frequency (e.g., millimeter wave (mmWave)) bands have been disposed in such electronic devices.

The above information is presented as background information only to assist with an understanding of the disclosure. No determination has been made, and no assertion is made, as to whether any of the above might be applicable as prior art with regard to the disclosure.

SUMMARY

There is a need to examine the performance of a wireless communication circuit that supports wireless communication in the ultra-high frequency (e.g., millimeter wave (mmWave)) band.

One method of measuring the performance of an existing wireless communication circuit is to verify the performance of a transmitter and/or receiver in a range that meets a far-field condition. However, in order to satisfy the far-field condition, a significantly large space is required for verification.

Another method is to electrically connect an output of a transmitter path and an output of a receiver path to verify the performance of the transmitter and/or receiver. In the case of wireless communication in an mmWave band, an output of the transmitter path is so large that a low noise amplifier of the receiver is saturated, making it difficult to verify accurate performance.

Aspects of the disclosure are to address at least the above-mentioned problems and/or disadvantages and to provide at least the advantages described below. Accordingly an aspect of the disclosure is to provide a method for verifying the performance of a communication circuit based on a signal transmitted and received via an antenna that may be used in a confined space. Another aspect of the disclosure is to provide a method for preventing saturation of a low noise amplifier of a receiver by ensuring isolation of a transmitter and the receiver.

In accordance with an aspect of the disclosure, an electronic device is provided. The electronic device includes a patch antenna element, at least one antenna including a first feeding unit electrically connected to the patch antenna element and a second feeding unit electrically connected to the patch antenna element so as to have a designated isolation for a signal that is input to the first feeding unit, a radio frequency integrated circuit (RFIC) which includes a first communication circuit including a first transmission circuit and a first reception circuit which are electrically connected to the first feeding unit, and a second communication circuit including a second transmission circuit and a second reception circuit which are electrically connected to the second feeding unit, and a processor, wherein the processor is configured to: output a designated transmission signal by using the first transmission circuit via the at least one antenna, acquire a reception signal, which is the designated transmission signal having been attenuated according to the designated isolation, by using the second reception circuit via the at least one antenna, and check a state of the first transmission circuit, the second reception circuit, the RFIC, the processor, or a combination thereof at least based on a difference between the designated transmission signal and the reception signal.

In accordance with another aspect of the disclosure, an electronic device is provided. The electronic device includes an antenna element including a first feeding unit and a second feeding unit, a first communication circuit including a first transmission unit that transmits a first signal via the first feeding unit and a first reception unit that receives the first signal via the first feeding unit, a second communication circuit including a second transmission unit that transmits a second signal via the second feeding unit and a second reception unit that receives the second signal via the second feeding unit, a first switch that enables the first transmission unit and the first reception unit to be optionally connected to the first feeding unit, a second switch that enables the second transmission unit and the second reception unit to be optionally connected to the second feeding unit, and a processor, wherein the processor is configured to: connect the first transmission unit and the antenna element by using the first switch, transfer a designated signal to the antenna element via the first transmission unit, connect the antenna element and the second reception unit by using the second switch, acquire the designated signal from the antenna element via the second reception unit, and check a state of the first transmission unit, the second reception unit, the processor, or a combination thereof based at least on a difference between the transferred designated signal and the acquired designated signal.

In accordance with yet another aspect of the disclosure, an electronic device is provided. The electronic devices includes a first antenna element that communicates a first signal, a second antenna element that communicates a second signal, a first communication circuit including a first transmission unit that transmits the first signal by using the first antenna element, and a first reception unit that receives the first signal by using the first antenna element, a second communication circuit including a second transmission unit that transmits the second signal by using the second antenna element and a second reception unit that receives the second signal by using the second antenna element, a first switch that enables the first transmission unit and the first reception unit to be optionally connected to the first antenna element, and a second switch that enables the second transmission unit and the second reception unit to be optionally connected to the second antenna element, and a processor, wherein the processor is configured to: connect the first transmission unit and the first antenna element by using the first switch so as to transmit a designated signal, connect the second antenna and the second transmission unit by using the second switch so as to acquire the designated signal, which is transmitted via the first antenna element, via the second antenna element, and check a state of the first communication circuit, the second communication circuit, the processor, or a combination thereof based at least on a difference between the transmitted designated signal and the designated signal acquired via the second antenna element.

According to various embodiments of the disclosure, a method for verifying the performance of a communication circuit based on a signal transmitted and received via an antenna may enable verification of the performance of a wireless communication circuit that supports wireless communication in an ultra-high frequency (mmWave) band within a predetermined space.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 7 is a flowchart illustrating a method for checking the performance of a communication circuit according to an embodiment of the disclosure;

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
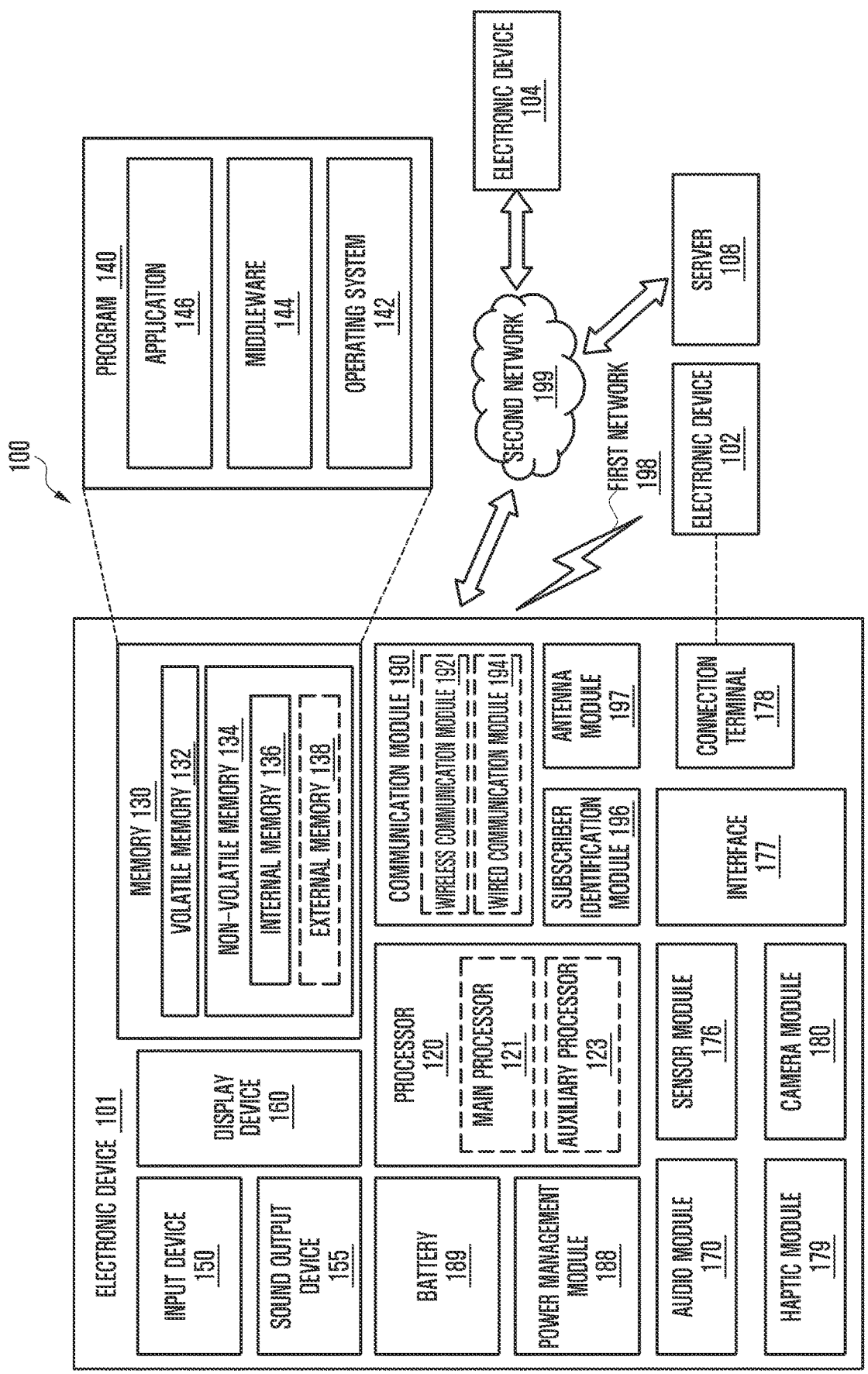
FIG. 1 is a block diagram of an electronic device 101 within a network environment 100 according to an embodiment of the disclosure.

FIG. 1 is a block diagram illustrating an electronic device 101 in a network environment 100 according to an embodiment of the disclosure. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by another component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming call. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture an image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
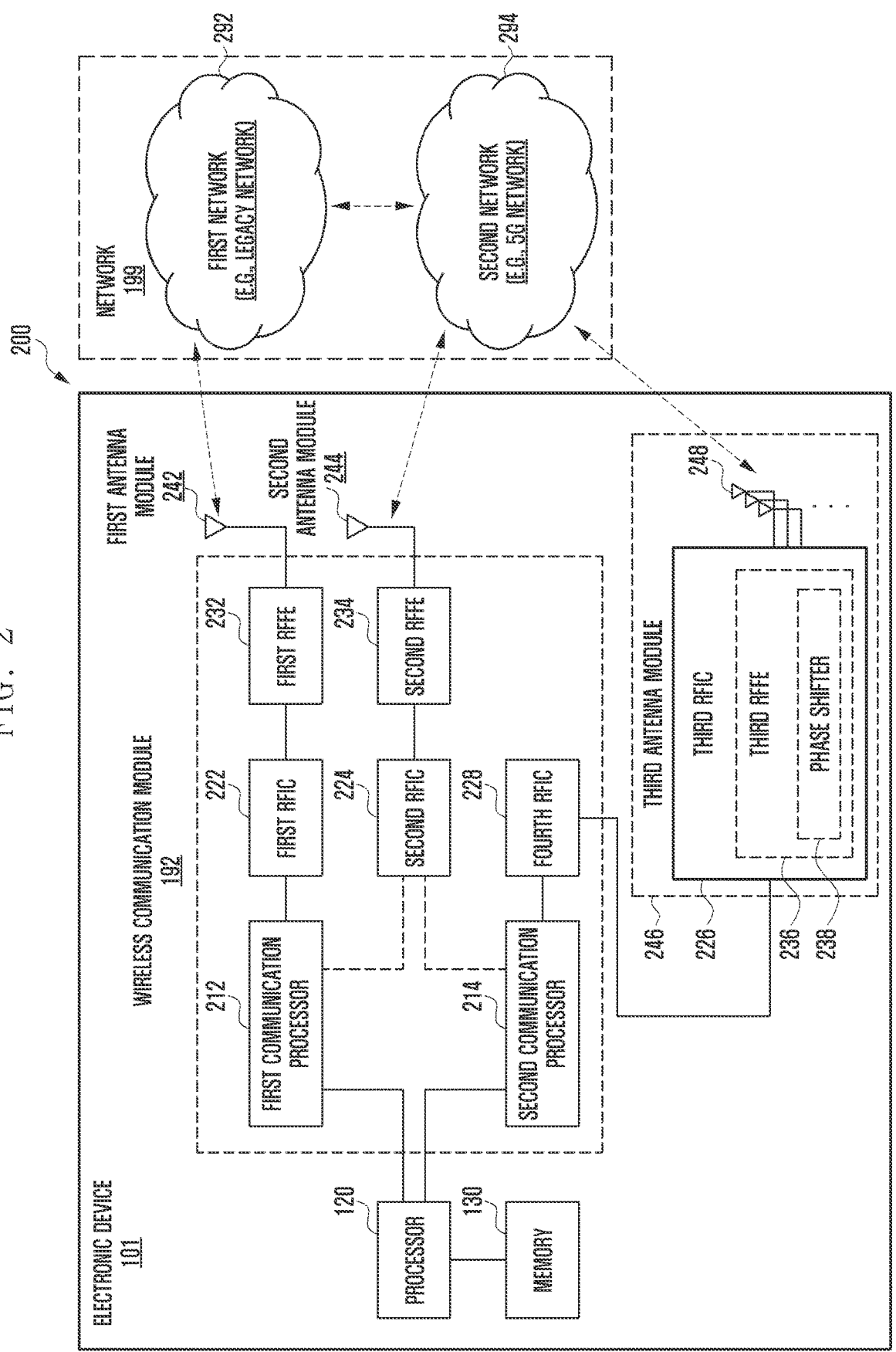
FIG. 2 is a block diagram 200 of the electronic device 101 that supports legacy network communication and 5G network communication according to an embodiment of the disclosure.

FIG. 2 is a block diagram 200 of an electronic device 101 for supporting legacy network communication and 5G network communication according to an embodiment of the disclosure.

Referring to FIG. 2, the electronic device 101 may include a first communication processor 212, a second communication processor 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include a processor 120 and a memory 130.

The network 199 may include a first network 292 and a second network 294. According to another embodiment, the electronic device 101 may further include at least one component among the components illustrated in FIG. 1, and the network 199 may further include at least one different network. According to an embodiment, the first communication processor 212, the second communication processor 214, the first RFIC 222, the second RFIC 224, the fourth RFIC 228, the first RFFE 232, and the second RFFE 234 may form at least a part of the wireless communication module 192. According to another embodiment, the fourth RFIC 228 may be omitted or included as a part of the third RFIC 226.

The first communication processor 212 may support establishment of a communication channel in a band to be used for wireless communication with the first network 292, and legacy network communication through the established communication channel. According to various embodiments, the first network may be a legacy network including a 2G, 3G, 4G, or long term evolution (LTE) network. The second communication processor 214 may support establishment of a communication channel corresponding to a designated band (for example, about 6 GHz to about 60 GHz) among bands to be used for wireless communication with the second network 294, and 5G network communication through the established communication channel. According to various embodiments, the second network 294 may be a 5G network defined by third generation partnership project (3GPP). Additionally, according to an embodiment, the first communication processor 212 or the second communication processor 214 may support establishment of a communication channel corresponding to another designated band (for example, about 6 GHz or lower) among the bands to be used for wireless communication with the second network 294, and 5G network communication through the established communication channel. According to an embodiment, the first communication processor 212 and the second communication processor 214 may be implemented inside a single chip or a single package. According to various embodiments, the first communication processor 212 or the second communication processor 214 may be formed inside a single chip or a single package together with a processor 120, an auxiliary processor 123, or a communication module 190.

The first RFIC 222 may convert a baseband signal generated by the first communication processor 212 into a radio frequency (RF) signal at about 700 MHz to about 3 GHz, which is used for the first network 292 (for example, legacy network), during transmission. During reception, an RF signal may be acquired from the first network 292 (for example, legacy network) through an antenna (for example, the first antenna module 242), and may be preprocessed through an RFFE (for example, the first RFFE 232). The first RFIC 222 may convert the preprocessed RF signal into a baseband signal such that the same can be processed by the first communication processor 212.

The second RFIC 224 may convert a baseband signal generated by the first communication processor 212 or the second communication processor 214 into an RF signal in a Sub6 band (for example, about 6 GHz or lower) (hereinafter, referred to as a 5G Sub6 RF signal) that is used for the second network 294 (for example, 5G network). During reception, a 5G Sub6 RF signal may be acquired from the second network 294 (for example, 5G network) through an antenna (for example, the second antenna module 244), and may be preprocessed through an RFFE (for example, the second RFFE 234). The second RFIC 224 may convert the preprocessed 5G Sub6 RF signal into a baseband signal such that the same can be processed by a communication processor corresponding to the first communication processor 212 or the second communication processor 214.

The third RFIC 226 may convert a baseband signal generated by the second communication processor 214 into an RF signal in a 5G Above6 band (for example, about 6 GHz to about 60 GHz) (hereinafter, referred to as a 5G Above6 signal) that is to be used for the second network 294 (for example, 5G network). During reception, a 5G Above6 RF signal may be acquired from the second network 294 (for example, 5G network) through an antenna (for example, the antenna 248), and may be preprocessed through the third RFFE 236. The third RFIC 226 may convert the preprocessed 5G Above6 signal into a baseband signal such that the same can be processed by the second communication processor 214. According to an embodiment, the third RFFE 236 may be formed as a part of the third RFIC 226.

According to an embodiment, the electronic device 101 may include a fourth RFIC 228 separately from the third RFIC 226 or as at least a part thereof. In this case, the fourth RFIC 228 may convert a baseband signal generated by the second communication processor 214 into an RF signal in an intermediate frequency band (for example, about 9 GHz to about 11 GHz) (hereinafter, referred to as an IF signal) and then deliver the IF signal to the third RFIC 226. The third RFIC 226 may convert the IF signal into a 5G Above6 RF signal. During reception, a 5G Above6 RF signal may be received from the second network 294 (for example, 5G network) through an antenna (for example, antenna 248) and converted into an IF signal by the third RFIC 226. The fourth RFIC 228 may convert the IF signal into a baseband signal such that the same can be processed by the second communication processor 214.

According to an embodiment, the first RFIC 222 and the second RFIC 224 may be implemented as at least a part of a single chip or a single package. According to an embodiment, the first RFFE 232 and the second RFFE 234 may be implemented as at least a part of a single chip or a single package. According to an embodiment, at least one antenna module of the first antenna module 242 or the second antenna module 244 may be omitted or coupled to another antenna module so as to process RF signal in multiple corresponding bands.

According to an embodiment, the third RFIC 226 and the antenna 248 may be arranged on the same substrate so as to form a third antenna module 246. For example, the wireless communication module 192 or the processor 120 may be arranged on a first substrate (for example, main PCB). In this case, the third RFIC 226 may be formed on a partial area (for example, lower surface) of a second substrate (for example, sub PCB) that is separate from the first substrate, and the antenna 248 may be arranged in another partial area (for example, upper surface), thereby forming a third antenna module 246. The third RFIC 226 and the antenna 248 may be arranged on the same substrate such that the length of the transmission line between the same can be reduced. This may reduce loss (for example, attenuation) of a signal in a high-frequency band (for example, about 6 GHz to about 60 GHz) used for 5G network communication, for example, due to the transmission line. Accordingly, the electronic device 101 may improve the quality or speed of communication with the second network 294 (for example, 5G network).

According to an embodiment, the antenna 248 may be formed as an antenna array including multiple antenna elements that may be used for beamforming. In this case, the third RFIC 226 may include multiple phase shifters 238 corresponding to the multiple antenna elements, as a part of the third RFFE 236, for example. During transmission, each of the multiple phase shifters 238 may shift the phase of a 5G Above6 RF signal, which is to be transmitted to the outside (for example, base station of 5G network) of the electronic device 101, through a corresponding antenna element. During reception, each of the multiple phase shifters 238 may shift the phase of a 5G Above6 RF signal received from the outside into the same or substantially same phase through a corresponding antenna element. This enables transmission or reception through beamforming between the electronic device 101 and the outside.

The second network 294 (for example, 5G network) may be operated independently of the first network 292 (for example, legacy network) (for example, standalone (SA)), or operated while being connected thereto (for example, non-standalone (NSA)). For example, the 5G network may include only an access network (for example, 5G radio access network (RAN) or next-generation network (NG RAN)) and include no core network (for example, next-generation core (NGC)). In this case, the electronic device 101 may access the access network of the 5G network and then access an external network (for example, Internet) under the control of the core network (for example, evolved packed core (EPC)) of the legacy network. Protocol information (for example, LTE protocol network) for communication with the legacy network or protocol information (for example, new radio (NR) protocol information) for communication with the 5G network may be stored in the memory 130, and may be accessed by another component (for example, the processor 120, the first communication processor 212, or the second communication processor 214).

Figure 3:
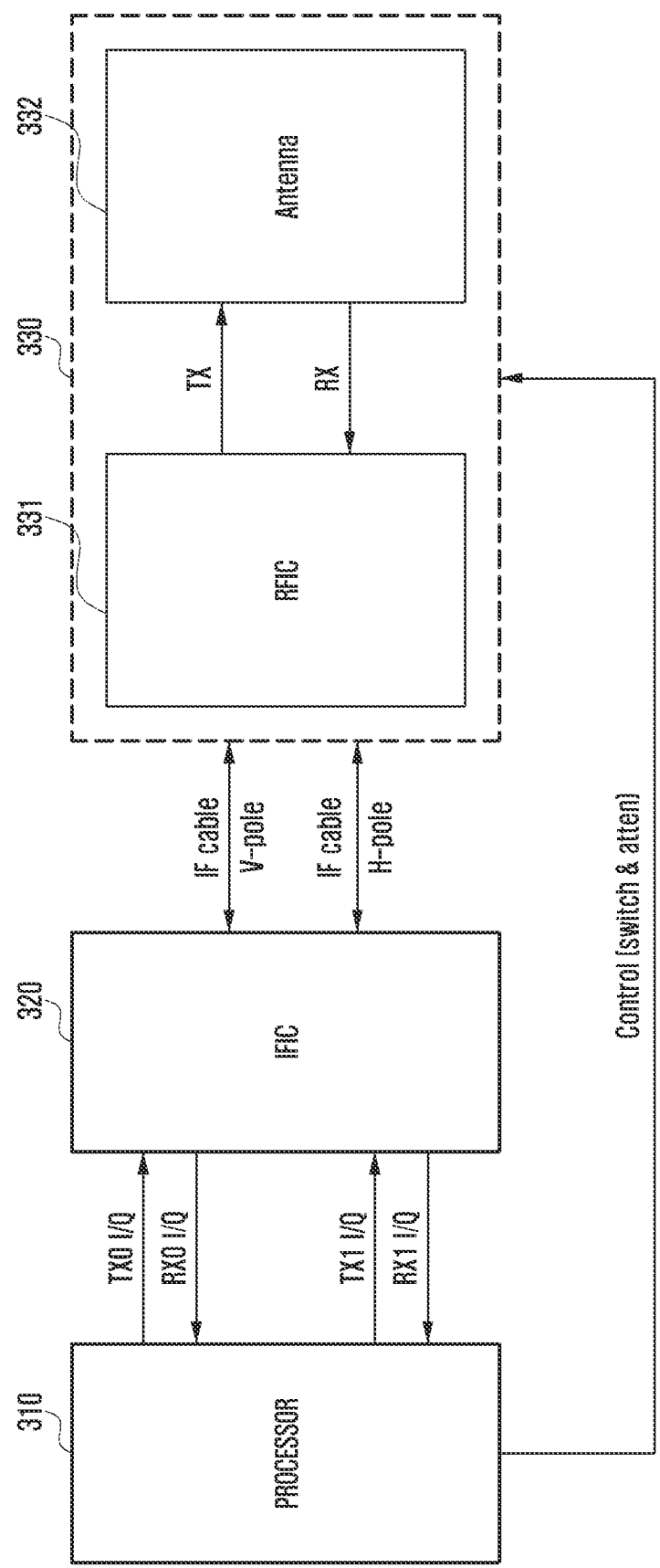
FIG. 3 is a block diagram of the electronic device 101 that supports wireless communication in an ultra-high frequency (mmWave) band according to an embodiment of the disclosure.

FIG. 3 is a block diagram of the electronic device 101 that supports wireless communication in an ultra-high frequency (mmWave) band according to an embodiment of the disclosure. Referring to FIG. 3, the electronic device 101 may include a processor 310, an intermediate frequency integrated circuit (IFIC) 320, and an antenna module 330. According to another embodiment, the electronic device 101 may further include at least one of components described in FIG. 1 or FIG. 2.

The processor 310 according to various embodiments may be the processor 120 of FIG. 1 or the second communication processor 214 of FIG. 2. The processor 310 may control at least one other element (e.g., a hardware element or a software element) of the electronic device 101, which is connected to the processor 310, and may perform various data processing or calculation. The processor 310 may establish a communication channel corresponding to a designated band (e.g., about 6 GHz to about 60 GHz) among bands to be used for wireless communication with a second network 294, and may support 5G network communication via the established communication channel. According to an embodiment, the processor 310 may concurrently control one or more transmission circuits and/or one or more reception circuits. According to an embodiment, the processor 310 may control an on/off operation of at least one switch included in the antenna module 330. In some embodiments, the processor 310 may adjust a bias setting value of an attenuator included in the antenna module 330 so as to allow a designated isolation.

According to various embodiments, an IFIC 320 may be the fourth RFIC 228 of FIG. 2. The IFIC 320 may convert a baseband signal generated by the processor 310 into an RF signal (hereinafter, referred to as an IF signal) in an intermediate frequency band (e.g., about 7 GHz to about 14 GHz). The IFIC 320 may provide an IF signal to the antenna module 330, or may convert the IF signal received from the antenna module 330 into the baseband signal so as to transmit the converted baseband signal to the processor 310. According to an embodiment, the IFIC 320 may concurrently convert one or more IF signals into the baseband signal, or may concurrently convert one or more baseband signals into the IF signals. According to an embodiment, the IFIC 320 may include one or more reception circuits and/or one or more transmission circuits to support a plurality of frequency bands, a plurality of radio technologies, carrier aggregation, and the like.

According to various embodiments, the antenna module 330 may include an RFIC 331 and/or an antenna device 332. According to an embodiment, the RFIC 331 may be the third RFIC 226 of FIG. 2. The RFIC 331 may include one or more reception circuits and/or one or more transmission circuits to support a plurality of frequency bands, a plurality of radio technologies, carrier aggregation, and the like. According to an embodiment, the IFIC 320 is at least a part of the RFIC 331 and may be included in the RFIC 331.

According to various embodiments, the IFIC 320 and the RFIC 331 may be connected by a cable carrying a vertical polarization signal and a cable carrying a horizontal polarization signal. However, the IFIC 320 and the RFIC 331 are not limited thereto and may be connected by one cable or a plurality of cables.

According to various embodiments, the antenna device 332 may include at least one antenna that supports at least one technology of a beamforming technology, a massive multiple input multiple output (MIMO) technology, a full dimensional MIMO (FD-MIMO) technology, an array antenna technology, an analog beam-forming technology, or a large scale antenna technology. For example, the antenna device 332 may include a patch antenna element supporting a beamforming technology. In some examples, the antenna device 332 may include a plurality of antennas to support a MINO technology. In some examples, the antenna device 332 may include one or more horizontal antennas and one or more vertical antennas, and may support a MIMO technology of an interleaved array scheme. The size and shape of each of the antennas within the antenna device 332 may vary depending on a supported resonant frequency.

If the antenna device 332 includes a plurality of antennas, it may be difficult to check performance of a single path connected to a specific antenna. For example, because lines are connected to antennas other than a specific antenna required to be verified, a leakage signal may be generated thereby. Therefore, it is necessary to block a path other than the single path, for which a performance check is desired, to prevent signal leakage. According to an embodiment, a line connected to each of the plurality of antennas may include a switch. If the switch is turned on, the antenna may be seen as an open circuit. Therefore, a path other than the path for performance verification may be blocked. According to an embodiment, a switch may be disposed at a point corresponding to a length of about 2¼ of an operation frequency at a point (branch point) where each of the plurality of antennas is branched. For example, if it is necessary to check performance of a first antenna, switches connected to antennas other than the first antenna may be turned on, and performance of a single path connected to the first antenna may be checked.

According to various embodiments, the IFIC 320 and or the RFIC 331 may include at least one duplexer (or diplexer). At least one duplexer may selectively modify a path through which a signal is transferred. For example, the electronic device 101 may control a path by using at least one duplexer so that at least a part of a signal transmitted from a transmission circuit is received through a reception circuit.

Figure 4A:
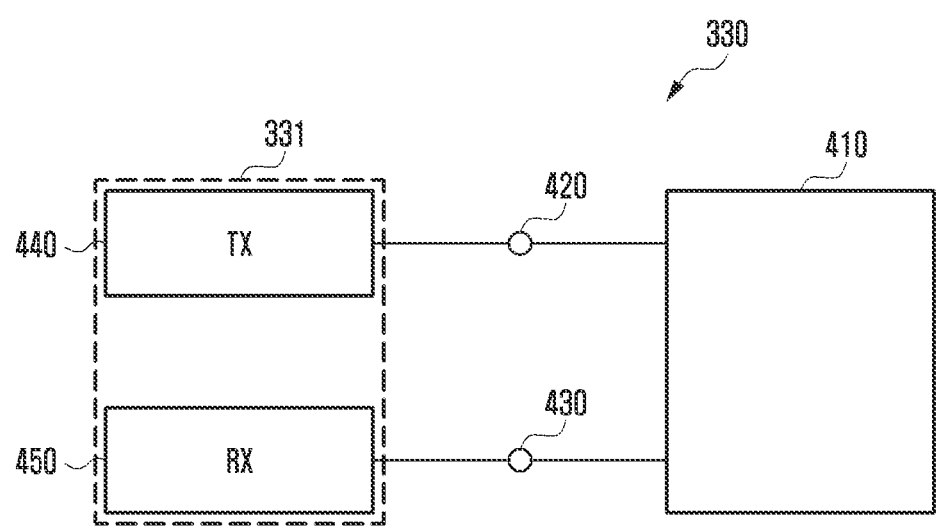
FIG. 4A is a block diagram of an antenna module 330 according to an embodiment of the disclosure.
Figure 4B:
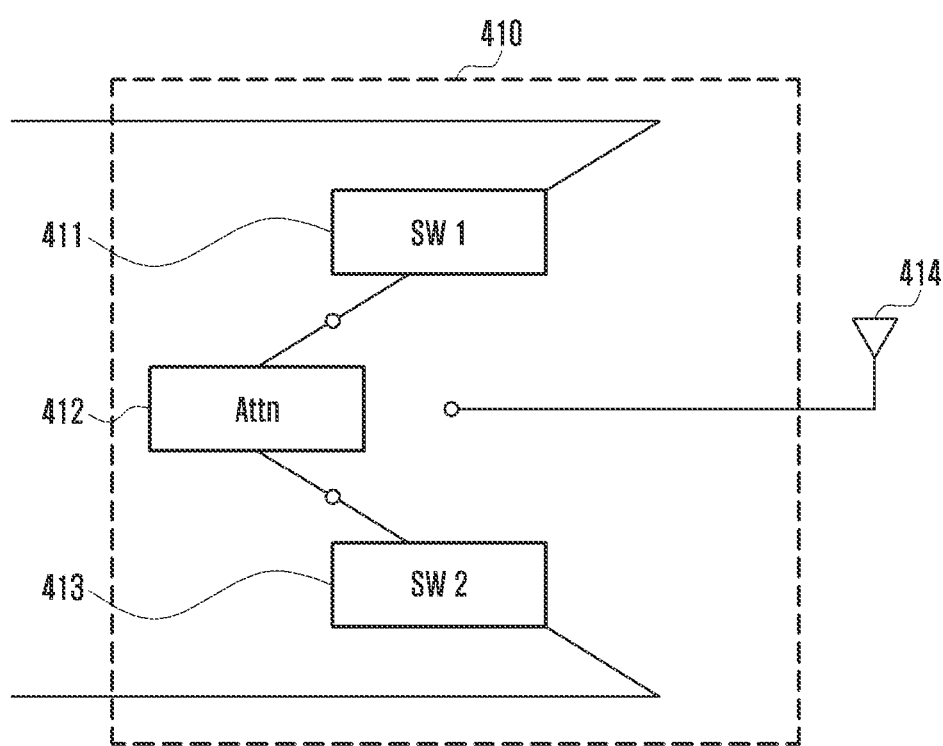
FIG. 4B is a block diagram of the antenna module 330 according to an embodiment of the disclosure.
Figure 4C:
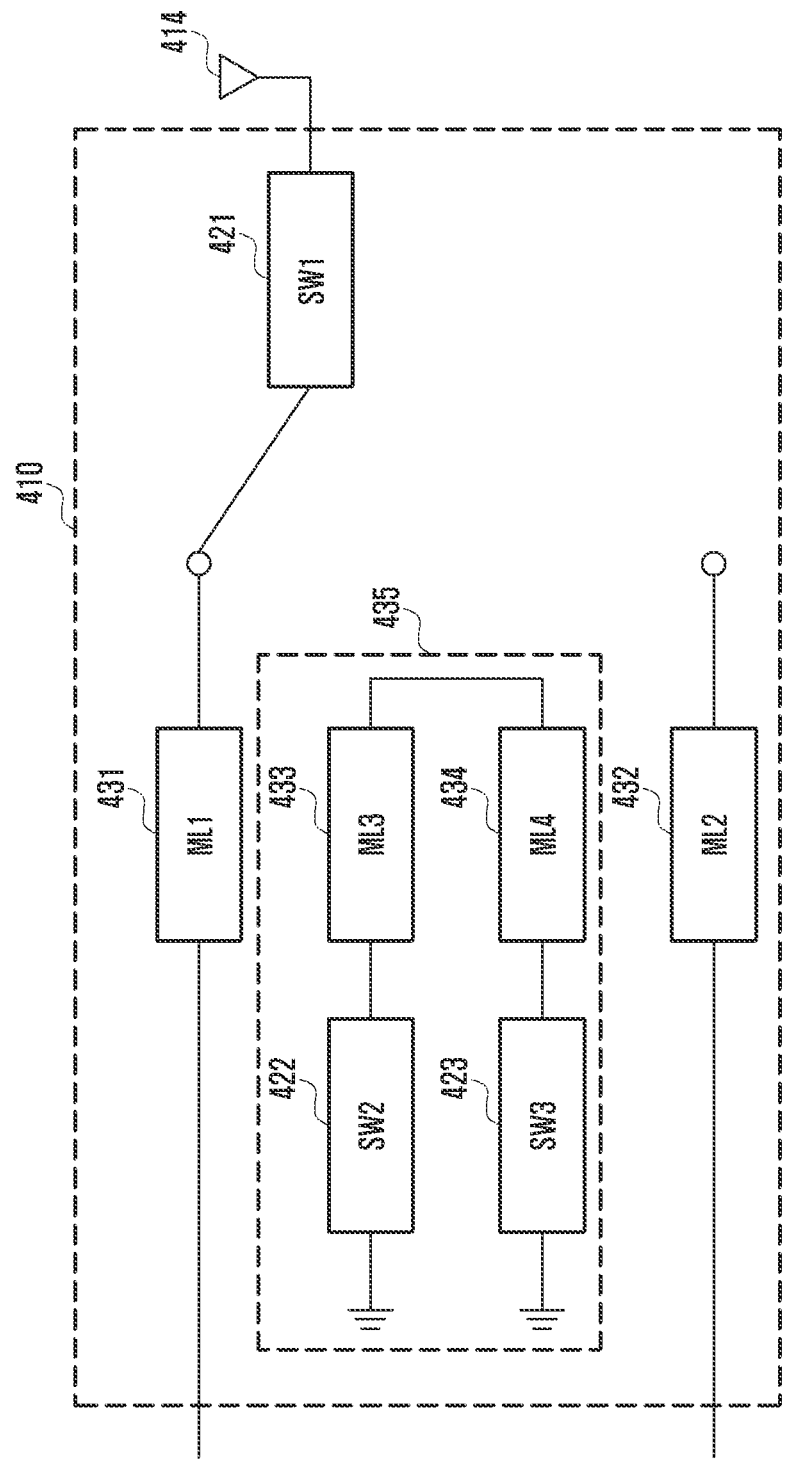
FIG. 4C is a block diagram of the antenna module 330 according to an embodiment of the disclosure.

FIG. 4A is a block diagram of an antenna module 330 according to various embodiments, FIG. 4B is a block diagram of the antenna module 330 according to various embodiments, and FIG. 4C is a block diagram of the antenna module 330 according to an embodiment of the disclosure. Referring to FIG. 4A, the antenna module 330 may include the RFIC 331 and/or the antenna device 332. According to an embodiment, the RFIC 331 may be the third RFIC 226 of FIG. 2. For example, the RFIC 331 may include a transmission circuit 440 electrically connected to a first feeding unit 420 and a reception circuit 450 electrically connected to a second feeding unit 430. According to an embodiment, the transmission circuit 440 may be included in a first communication circuit, and the reception circuit 450 may be included in a second communication circuit distinguished from the first communication circuit. In some embodiments, the first communication circuit may include another reception circuit, and the second communication circuit may include another transmission circuit.

According to an embodiment, the antenna device 332 may include at least one antenna 410. FIG. 4A illustrates, for the convenience of description, a structure in which the antenna device 332 includes one antenna 410, but the antenna device 332 may include a plurality of antennas 410. For example, the antenna device 332 may include a plurality of antennas 410 connected in parallel to support the MIMO technology.

According to various embodiments, the antenna 410 may include the first feeding unit 420 for connection to the transmission circuit 440, and the second feeding unit 430 for connection to the reception circuit 450.

According to various embodiments, the antenna 410 may include a patch antenna element. The size and shape of the patch antenna element may vary depending on a supported resonant frequency.

According to various embodiments, the first feeding unit 420 may be electrically connected to the patch antenna element. According to an embodiment, the first feeding unit 420 and the patch antenna element may be optionally connected using a switching circuit disposed between the first feeding unit 420 and the patch antenna element.

According to various embodiments, the second feeding unit 430 may be electrically connected to the patch antenna element. According to an embodiment, the second feeding unit 430 and the patch antenna element may be optionally connected using a switch disposed between the second feeding unit 430 and the patch antenna element. According to an embodiment, the electronic device 101 may allow one of the first feeding unit 420 and the second feeding unit 430 to be optionally connected to the patch antenna element by using one switch. In some embodiments, a switch that connects the first feeding unit 420 and the patch antenna element and a switch that connects the second feeding unit 430 and the patch antenna element may be separately present.

According to various embodiments, the second feeding unit 430 may have a designated isolation for a signal that is input to the first feeding unit 420. For example, the signal that is input to the first feeding unit 420 may be attenuated by a predetermined amount using an isolator connected to the first feeding unit 420 and the second feeding unit 430, and then the attenuated signal may be transferred to the second feeding unit 430. For example, when one among a resonant isolator using ferrite gyro magnetic properties, a field displacement type isolator, a Faraday rotation type isolator, an edge mode type isolator, a Hall isolator using a non-reflective property of a Hall effect, a microwave or millimeter wave isolator, and an optical isolator using Faraday rotation by a polarizer is disposed between the first feeding unit 420 and the second feeding unit 430, the signal transferred from the first feeding unit 420 to the second feeding unit 430 may be attenuated by a specified isolation.

According to an embodiment, the antenna module 330 may allow the second feeding unit 430 to have the designated isolation for the signal that is input to the first feeding unit 420, by disposing an attenuator between the first feeding unit 420 and the second feeding unit 430.

According to an embodiment, the antenna module 330 may allow the second feeding unit 430 to have the designated isolation for the signal that is input to the first feeding unit 420, by disposing a coupler in at least a partial space between a first line connected to the first feeding unit 420 and a second line connected to the second feeding unit 430.

According to various embodiments, the processor 310 may be configured to: output a designated transmission signal by using the transmission circuit 440 via at least one antenna 410; acquire a reception signal, that is the designated transmission signal having been attenuated according to the designated isolation, by using the reception circuit 450 via at least one antenna 410; and check a state of the processor 310, the IFIC 320, the RFIC 331, or a combination thereof as well as a state of the transmission circuit 440 and/or the reception circuit 450, based at least on a difference between the designated transmission signal and the reception signal. For example, the difference between the designated transmission signal and the reception signal may include at least one of a magnitude difference, a phase difference, or a frequency difference. In some embodiments, the processor 310 may perform calibration based on the state of the transmission circuit 440, the reception circuit 450, the processor 310, the IFIC 320, the RFIC 331, or a combination thereof, or may check whether there is abnormality in the transmission circuit 440, the reception circuit 450, the processor 310, the IFIC 320, the RFIC 331, or a combination thereof. For example, the calibration may include adjusting, to become a specified standard, the characteristics of transmission circuit 440, the reception circuit 450, the processor 310, the IFIC 320, the RFIC 331, or a combination thereof.

FIG. 4B is a diagram illustrating the antenna 410 in which an attenuator is disposed between the first feeding unit 420 and the second feeding unit 430 according to an embodiment of the disclosure.

Referring to FIG. 4B, the antenna 410 may include a first switch 411, an attenuator 412, and a second switch 413.

According to various embodiments, the first switch 411 may generate a path so that a signal that is input to the first feeding unit 420 is transferred to one of a patch antenna element 414 and the attenuator 412. According to various embodiments, the second switch 413 may generate a path so that one of a signal that is input via the patch antenna element 414 or a signal transferred via the attenuator 412 is transferred to the second feeding unit 430. According to an embodiment, the first switch 411 and/or the second switch 413 may include an SPDT switch having a low insertion loss and a high isolation.

If both the first switch 411 and the second switch 413 are connected to the attenuator 412, the signal that is input to the first feeding unit 420 may be transferred to the second feeding unit 430 via the attenuator 412. According to various embodiments, the attenuator 412 may attenuate the input signal by a designated isolation. The processor 310 may adjust an attenuation characteristic by adjusting voltage of a bias port within the attenuator 412. For example, the processor 310 may allow the second feeding unit 430 to have a designated isolation for the signal that is input to the first feeding unit 420, by adjusting the attenuation characteristic to one of various values from about 0.1 dB to about 32 dB. In some embodiments, additional attenuation characteristic may be implemented by adding a grounding path to a signal path of the attenuator 412. When the attenuator 412 is used, an attenuator 412 reception end may verify linearity performance of a low noise amplifier, and an attenuator 412 transmission end may verify a performance characteristic according to an output power. According to an embodiment, the processor 310 may be configured to check a state of the transmission circuit 440, the reception circuit 450, the processor 310, the IFIC 320, the RFIC 331, or a combination thereof, at least based on a difference between the designated transmission signal and the reception signal.

According to various embodiments, FIG. 4C is a diagram illustrating the antenna 410 in which a coupler 435 is disposed between a first line 431 connected to the first feeding unit 420 and a second line 432 connected to the second feeding unit 430 according to an embodiment of the disclosure.

Referring to FIG. 4C, the antenna 410 may include a first switch 421 and the coupler 435. According to an embodiment, the processor 310 may allow one of the first feeding unit 420 and the second feeding unit 430 to be optionally connected to the patch antenna element 414 by using the first switch 421. For example, when the first switch 421 is connected to the first feeding unit 420, the patch antenna element 414 may output a transmission signal received from the transmission circuit 440 via the first line 431. As another example, when the first switch 421 is connected to the second feeding unit 430, the signal received by the patch antenna element 414 may be transferred to the reception circuit 450 via the second line 432.

According to various embodiments, when the transmission circuit 440 outputs a transmission signal and a transmission current flows through the first line 431, a first induced current may be generated in a third line 433 of the coupler, which extends in parallel with the first line 431 in close proximity and is coupled by a first coupling factor. The magnitude of the first induced current may vary depending on the first coupling factor (e.g., a parameter value). For example, a generation rate of the first induced current may vary according to the length, thickness, material, and the like of the first line 431 and/or third line 433.

According to an embodiment, a second switch 422 which is disposed on at least a partial point of the third line 433 and is capable of adjusting the length of the third line 433 may further be included. For example, if the second switch 422 is opened, the length of the third line 433 may be shortened, and if the second switch 422 is shorted, the length of the third line 433 may become long. By adjusting the length of the third line 433, a ratio of generation of a first induced current to generation of the transmission current may be adjusted.

According to various embodiments, the third line 433 may be directly connected to a fourth line 434 and may transfer the first induced current. For the convenience of description, the third line 433 and the fourth line 434 are distinguished, but the third line 433 and the fourth line 434 may be substantially the same one line. When the first induced current flows through the fourth line 434, a second induced current may be generated in the second line 432, which extends in parallel with the fourth line 434 in close proximity and is coupled by a second coupling factor. The magnitude of the second induced current may vary depending on the second coupling factor (e.g., a parameter value).

According to an embodiment, a third switch 423 which is disposed on at least a partial point of the fourth line 434 and is capable of adjusting the length of the fourth line 434 may further be included. For example, if the third switch 423 is opened, the length of the fourth line 434 may be shortened, and if the third switch 423 is shorted, the length of the fourth line 434 may become long. By adjusting the length of the fourth line 434, a ratio of generation of the second induced current to generation of the first induced current may be adjusted.

According to various embodiments, based on the first coupling factor and the second coupling factor, an isolation that the second feeding unit 430 has with respect to a signal that is input to the first feeding unit 420 may be designated. The processor 310 may control the second switch 422 and the third switch 423 according to the designated isolation. For example, the processor 310 may control the second switch 422 and the third switch 423 so that the current flowing through the first line 431 is attenuated according to the designated isolation and flows through the fourth line 434. Although not illustrated, the coupler 435 may further include switches connected to the third line 433 and/or the fourth line 434, and as the number of the switches increases, various attenuation characteristics may be implemented.

According to an embodiment, the processor 310 may be configured to check a state of the transmission circuit 440, the reception circuit 450, the processor 310, the IFIC 320, the RFIC 331, or a combination thereof, based at least on a difference between the designated transmission signal and the reception signal.

Figure 5A:
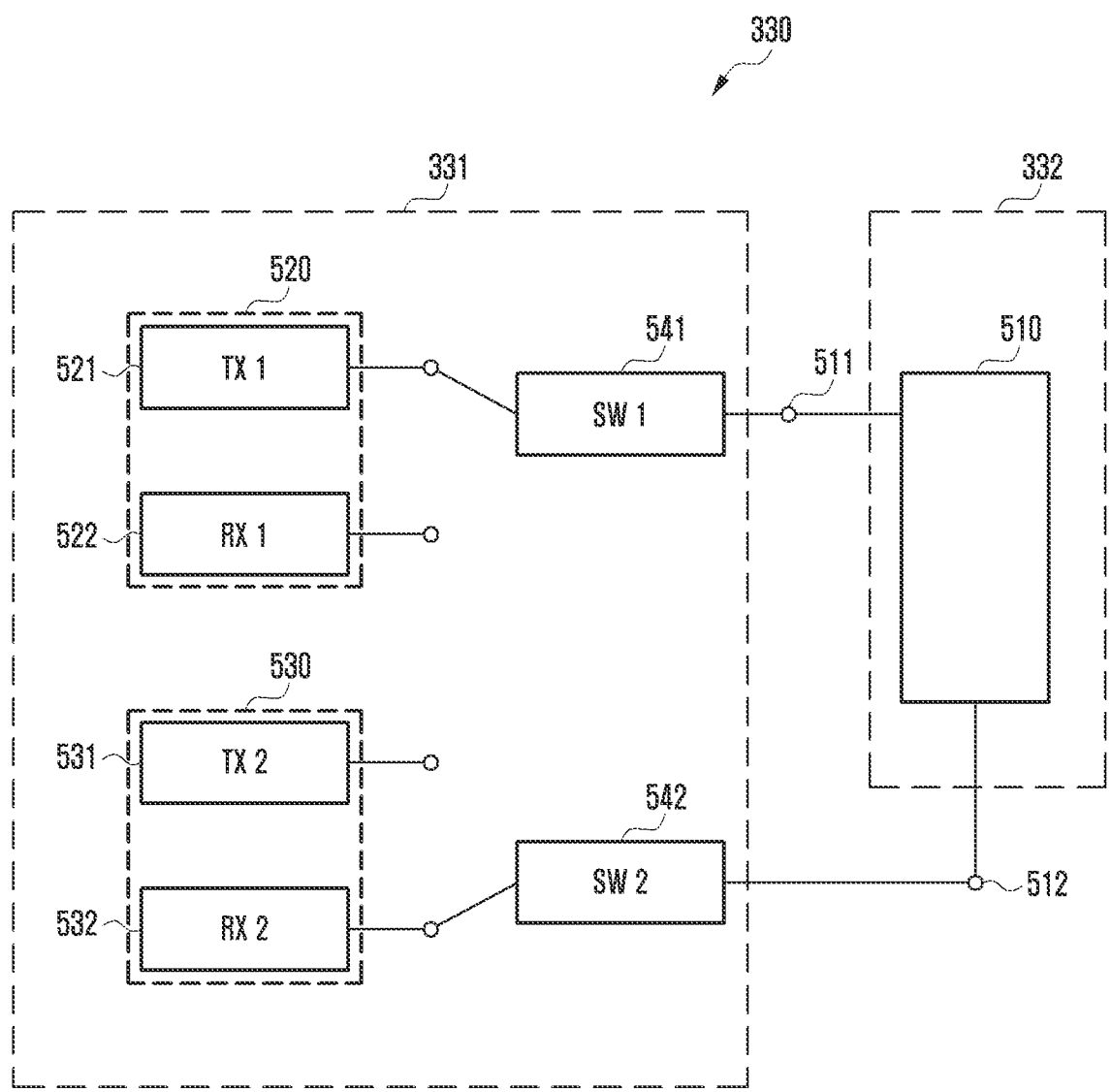
FIG. 5A is a block diagram of the antenna module 330 according to an embodiment of the disclosure.
Figure 5B:
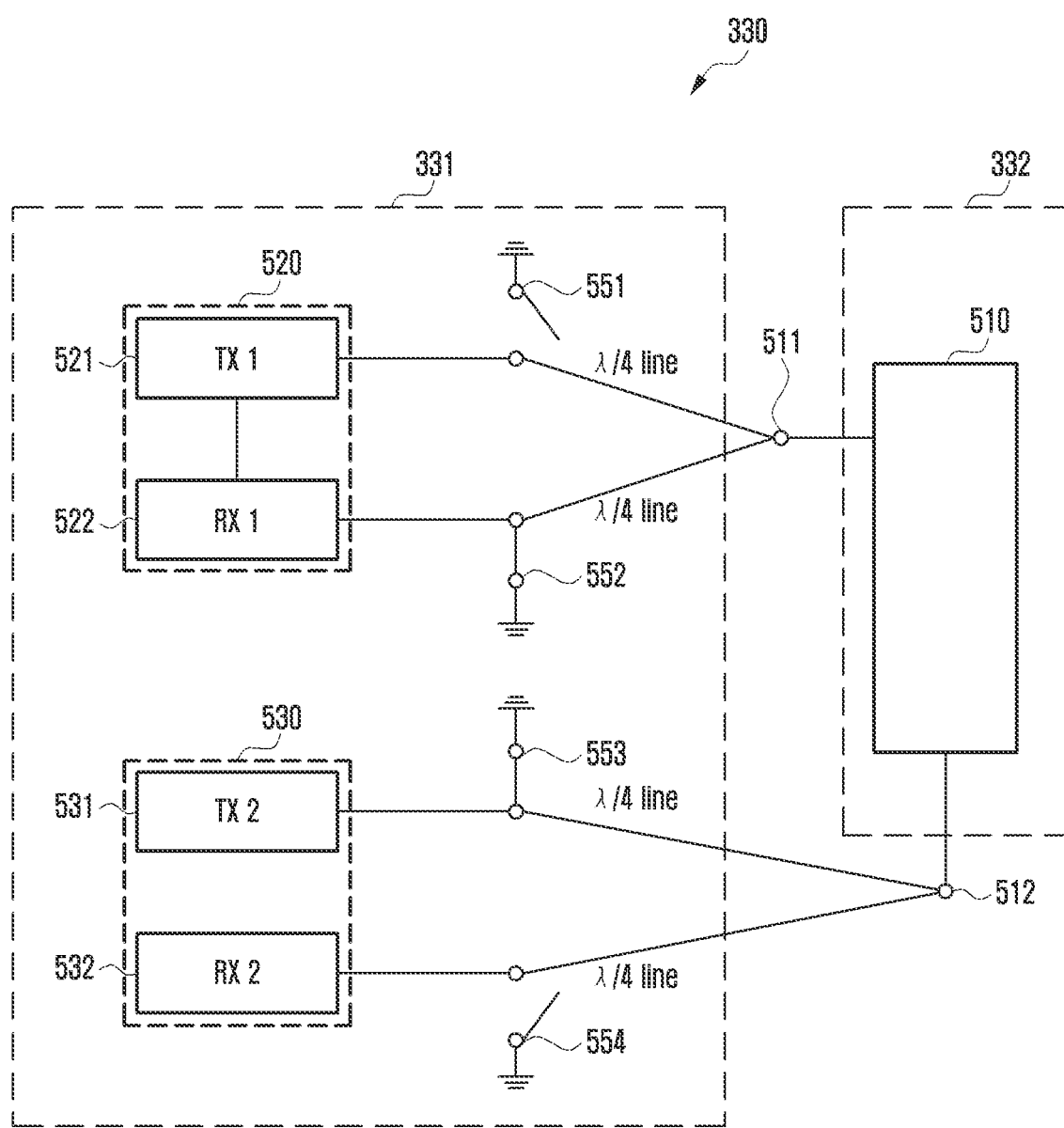
FIG. 5B is a block diagram of the antenna module 330 according to an embodiment of the disclosure.
Figure 5C:
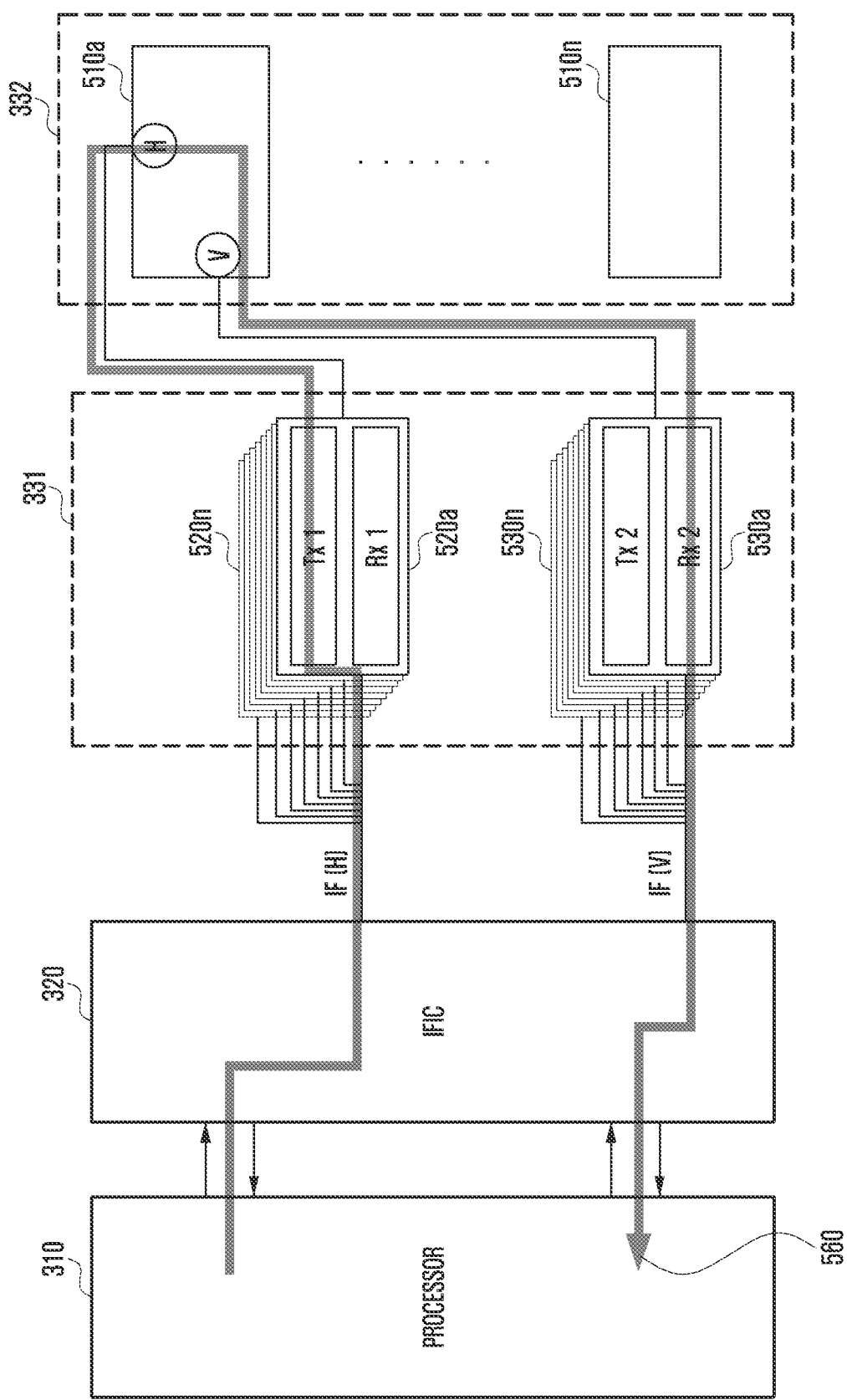
FIG. 5C is a block diagram of the antenna module 330 according to an embodiment of the disclosure.

FIG. 5A is a block diagram of the antenna module 330 according to an embodiment of the disclosure, FIG. 5B is a block diagram of the antenna module 330 according to an embodiment of the disclosure, and FIG. 5C is a block diagram of the antenna module 330 according to an embodiment of the disclosure. Referring to FIG. 5A to FIG. 5C, the antenna module 330 may include the RFIC 331 and/or the antenna device 332. According to an embodiment, the RFIC 331 may be the third RFIC 226 of FIG. 2. According to an embodiment, the RFIC 331 may include a plurality of communication circuits, for example, the RFIC 331 may include a first communication circuit 520 and a second communication circuit 530.

According to an embodiment, the first communication circuit 520 may be electrically connected to a first feeding unit 511, and the second communication circuit 530 may be electrically connected to a second feeding unit 512. For example, the first communication circuit 520 may include a first transmission unit 521 that transmits a first signal via the first feeding unit 511, and a first reception unit 522 that receives the first signal via the first feeding unit 511. As another example, the second communication circuit 530 may include a second transmission unit 531 that transmits a second signal via the second feeding unit 512, and a second reception unit 532 that receives the second signal via the second feeding unit 512.

According to an embodiment, the antenna device 332 may include an antenna element 510 including the first feeding unit 511 and the second feeding unit 512. According to an embodiment, the antenna device 332 may include a plurality of antenna elements 510. In this case, the first communication circuit 520 and the second communication circuit 530 may be connected in parallel with the plurality of antenna elements 510, respectively.

According to an embodiment, the antenna element 510 may be electrically connected to the first communication circuit 520 and the second communication circuit 530. In this case, the first communication circuit 520 and the second communication circuit 530 may be configured to output polarization components perpendicular to each other. For example, the first communication circuit 520 may be configured to output a vertical/horizontal polarization component, and the second communication circuit 530 may be configured to output a vertical/horizontal polarization component.

Referring to FIG. 5A, according to various embodiments, the processor 310 may control connection by using a first switch 541 disposed in at least a partial space between the antenna element 510 and the first communication circuit 520. For example, according to an embodiment, the processor 310 may allow one of the first transmission unit 521 and the first reception unit 522 to be optionally connected to the first feeding unit 511 by using the first switch 541.

According to various embodiments, the processor 310 may control connection by using a second switch 542 disposed in at least a partial space between the antenna element 510 and the second communication circuit 530. For example, the processor 310 may allow the second transmission unit 531 or the second reception unit 532 to be optionally connected to the second feeding unit 512 by using the second switch 542. According to an embodiment, the first switch 541 and/or the second switch 542 may include an SPDT switch having a low insertion loss and a high isolation.

According to various embodiments, the processor 310 may connect the first transmission unit 521 and the antenna element 510 by using the first switch 541, may transfer a designated signal to the antenna element 510 via the first transmission unit 521, may connect the antenna element 510 and the second reception unit 532 by using the second switch 542, and may acquire the designated signal from the antenna element 510 via the second reception unit 532.

Referring to FIG. 5B, according to various embodiments, the first communication circuit 520 may be permanently connected to the antenna element 510 via the first feeding unit 511. For example, the first transmission unit 521 may be connected to the first feeding unit 511 via a first wiring, and the first reception unit 522 may be connected to the first feeding unit 511 via a second wiring. According to an embodiment, the first communication circuit 520 may include a first SPST switch 551 at a point of about λ/4 of the first wiring connecting the first transmission unit 521 and the first feeding unit 511. According to an embodiment, the first communication circuit 520 may include a second SPST switch 552 at a point of about λ/4 of the second wiring connecting the first reception unit 522 and the first feeding unit 511. According to various embodiments, each of the first SPST switch 551 and the second SPST switch 552 may be configured to be connected to ground. According to an embodiment, the processor 310 may allow one of the first transmission unit 521 or the first reception unit 522 to be optionally connected to the first feeding unit 511 by using the first SPST switch 551 and/or the second SPST switch 552. For example, when switching between the first SPST switch 551 and the ground is on, the connection between the first transmission unit 521 and the first feeding unit 511 may appear to be open, and when switching between the first SPST switch 551 and the ground is off, the connection between the first transmission unit 521 and the first feeding unit 511 may appear to be a short circuit.

According to various embodiments, the second communication circuit 530 may be permanently connected to the antenna element 510 via the second feeding unit 512. For example, the second transmission unit 531 may be connected to the second feeding unit 512 via a third wiring, and the second reception unit 532 may be connected to the second feeding unit 512 via a fourth wiring. According to an embodiment, the second communication circuit 530 may include a third SPST switch 553 at a point of about λ/4 of the third wiring connecting the second transmission unit 531 and the second feeding unit 512. The second communication circuit 530 may include a fourth SPST switch 554 at a point of about λ/4 of the fourth wiring connecting the second reception unit 532 and the second feeding unit 512. According to various embodiments, each of the third SPST switch 553 and the fourth SPST switch 554 may be configured to be connected to ground. According to an embodiment, the processor 310 may allow one of the second transmission unit 531 or the second reception unit 532 to be optionally connected to the second feeding unit 512 by using the third SPST switch 553 and/or the fourth SPST switch 554.

According to various embodiments, the processor 310 may control only the first transmission unit 521 to be connected to the antenna element 510 by using the second SPST switch 552, and may transfer a designated signal to the antenna element 510 via the first transmission unit 521. The processor 310 may control only the second reception unit 532 to be connected to the antenna element 510 by using the third SPST switch 553, and may acquire the designated signal from the antenna element 510 via the second reception unit 532.

According to various embodiments, the processor 310 may be configured to check a state of not only the first communication circuit 520 and the second communication circuit 530, but also the processor 310, the IFIC 320, the RFIC 331 or a combination thereof, based at least on a difference between the designated signal transferred to the processor 310 and the acquired designated signal.

According to an embodiment, the first communication circuit 520 and the second communication circuit 530 may show designated isolation characteristics. For example, because a predetermined part of the signal transmitted from the first communication circuit 520 is attenuated via the antenna element 510, a designated isolation characteristic may be shown between the first communication circuit 520 and the second communication circuit 530. For example, an isolation characteristic of about 15 dB to about 20 dB may be provided between the first communication circuit 520 and the second communication circuit 530.

According to an embodiment, the first reception unit 522 and/or the second reception unit 532 may include an attenuator. According to various embodiments, the attenuator may attenuate an input signal by a designated isolation. For example, a signal that is output from the first transmission unit 521 and transferred to the second reception unit 532 via the antenna element 510 may be attenuated according to the designated isolation by the attenuator included in the second reception unit 532. The processor 310 may be configured to check a state of the first communication circuit 520 and/or a state of the second communication circuit 530 based on a reception signal attenuated according to the designated isolation. As another example, the same may be the case when a signal is output from the second transmission unit 531 and transferred to the first reception unit 522 via the antenna element 510.

FIG. 5C illustrates a block diagram of the electronic device 101 according to an embodiment of the disclosure. According to various embodiments, the RFIC 331 may include a plurality of communication circuits. For example, the RFIC 331 may include a plurality of first communication circuits (e.g., 520a to 520n) supporting horizontal polarization components and a plurality of second communication circuits (e.g., 530a to 530n) supporting vertical polarization components.

According to various embodiments, the antenna device 332 may include a plurality of antenna elements connected in parallel to support the MIMO technology, and each antenna element may be connected to different first communication circuits and/or second communication circuits. According to an embodiment, an antenna element 510a may be connected to the first communication circuit 520a and the second communication circuit 530a. Also, an antenna element 510n may be connected to the first communication circuit 520n and the second communication circuit 530n.

Referring to FIG. 5C, according to various embodiments, a path of a signal 560 may be illustrated. For example, the first communication circuit 520a, an antenna element 510a, and the second communication circuit 530a are parts of the path of signal 560. The processor 310 may generate the signal 560 (e.g., a baseband signal) and may transfer the generated signal 560 to the IFIC 320. The IFIC 320 may convert the signal 560 received from the processor 310 into the signal 560 of an intermediate frequency band (e.g., about 7 GHz to about 14 GHz), and then may transfer the signal 560 to the RFIC 331. The RFIC 331 may receive the signal 560 (e.g., an IF signal) from the IFIC 320 by using the first communication circuit 520a, may convert the received signal 560 into a 5G Above6 RF signal, and may transfer the converted 5G Above6 RF signal to the antenna device 332.

According to various embodiments, the RFIC 331 may acquire, again, at least a part of the signal 560 transferred to the antenna device 332 by using the second communication circuit 530a. In this way, the signal 560 acquired by the second communication circuit 530a may be transferred back to the processor 310 via the IFIC 320. The signal transferred back to the processor 310 may include various information. For example, the processor may check a state of the first communication circuit 520a, the second communication circuit 530a, the processor 310, the IFIC 320, the RFIC 331, or a combination thereof by using at least one of a magnitude difference, a phase difference, or a frequency difference between a transmission signal and a reception signal. In some embodiments, the processor 3310 may perform calibration based on the state of the first communication circuit 520a, the second communication circuit 530a, the processor 310, the IFIC 320, the RFIC 331, or the combination thereof, or may check whether there is abnormality in the first communication circuit 520a, the second communication circuit 530a, the processor 310, the IFIC 320, the RFIC 331, or the combination thereof.

Figure 6A:
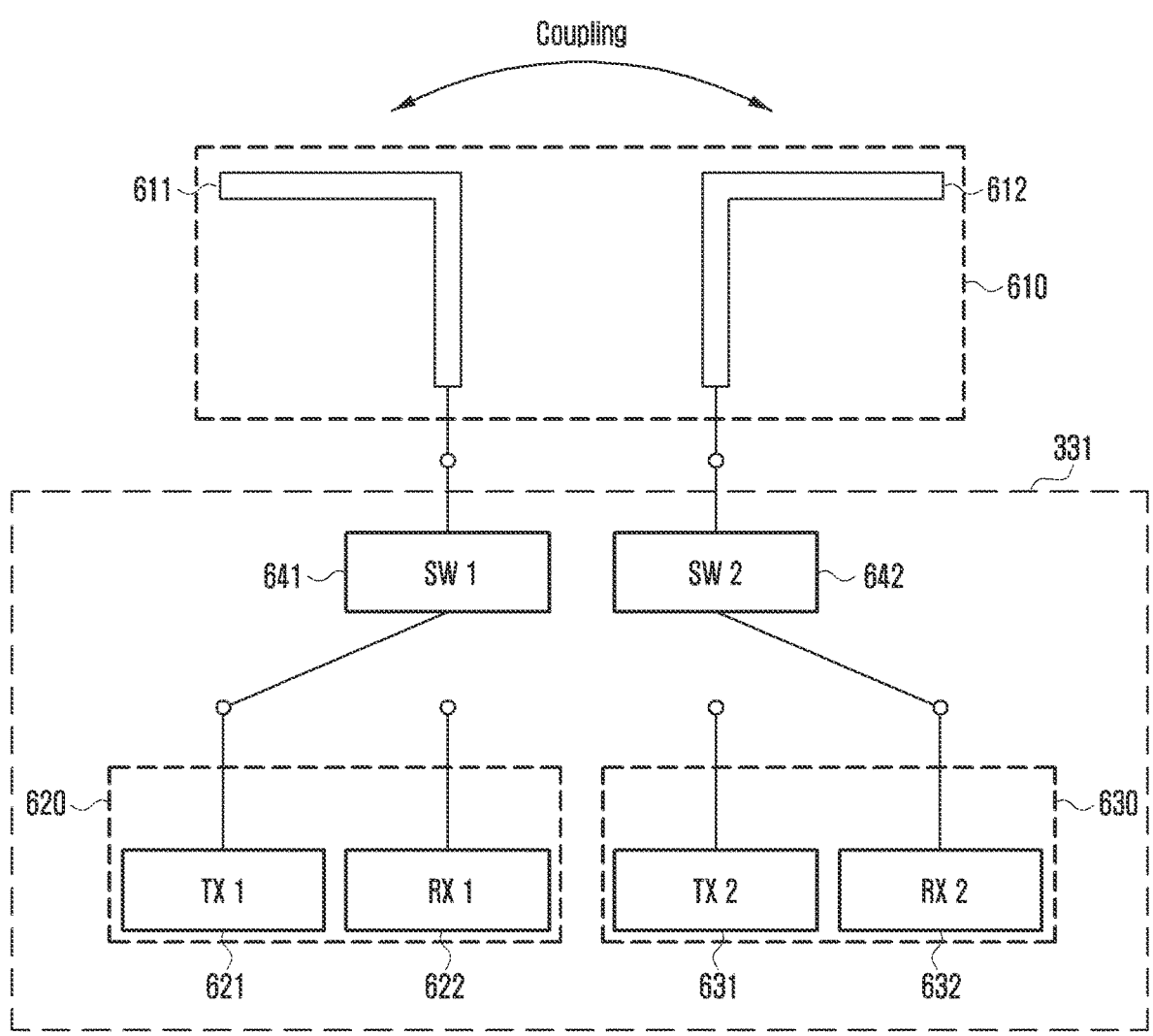
FIG. 6A is the block diagram of an antenna module 330 according to an embodiment of the disclosure.
Figure 6B:
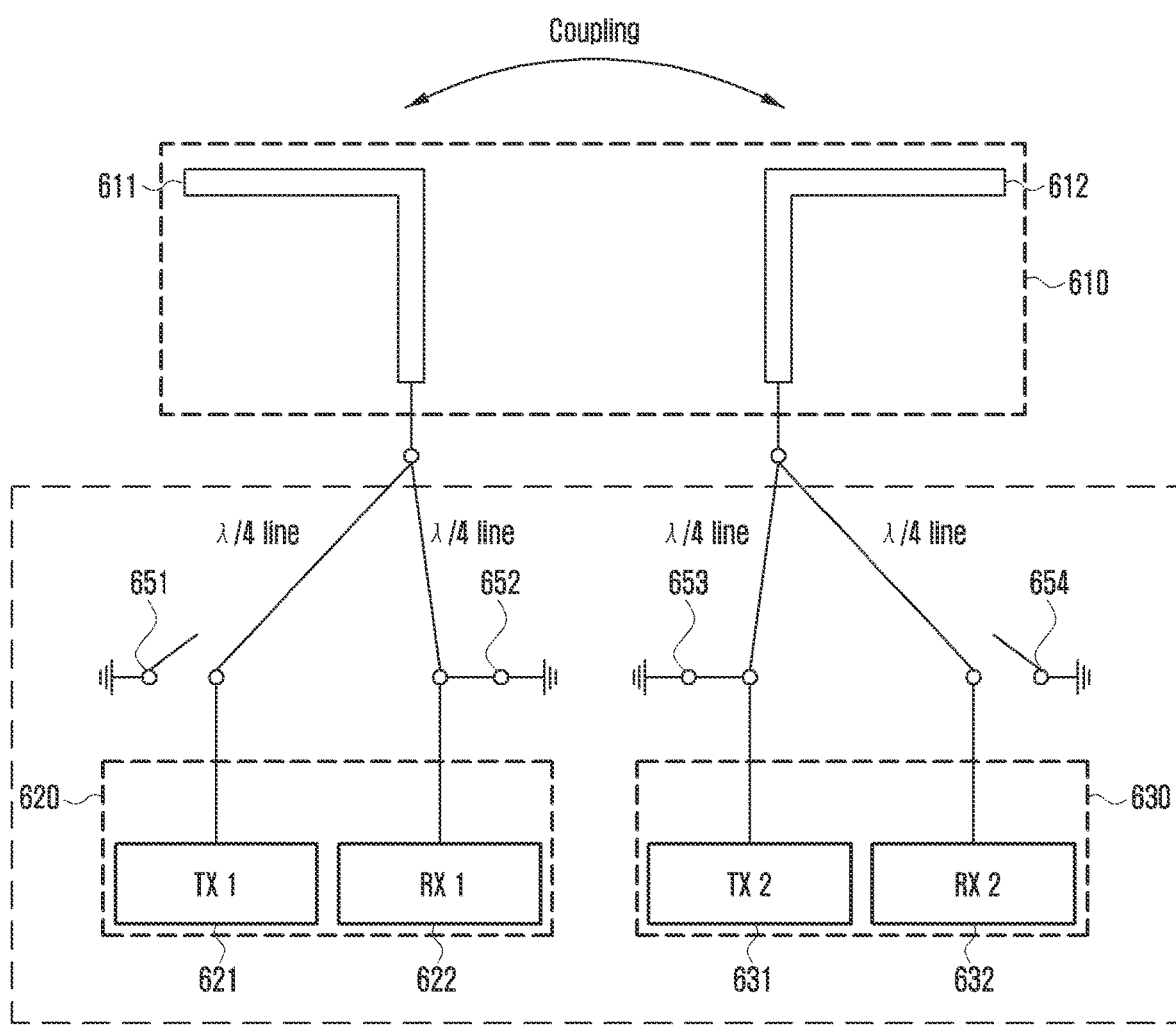
FIG. 6B is a block diagram of the antenna module 330 according to an embodiment of the disclosure.

FIG. 6A is the block diagram of an antenna module 330 according to various embodiments, and FIG. 6B is a block diagram of the antenna module 330 according to an embodiment of the disclosure. According to various embodiments, the antenna module 330 may include an RFIC 331 and/or an antenna device 332. According to an embodiment, the RFIC 331 may be the third RFIC 226 of FIG. 2. According to an embodiment, the RFIC 331 may include a plurality of communication circuits, for example, the RFIC 331 may include a first communication circuit 620 and a second communication circuit 630.

According to an embodiment, the antenna device 332 may include a first antenna element 611 that communicates a first signal and a second antenna element 612 that communicates a second signal. According to an embodiment, the first antenna element 611 and the second antenna element 612 may include a dipole antenna 610. For example, the dipole antenna 610 may be implemented using a coupling phenomenon occurring between the first antenna element 611 and the second antenna element 612. According to an embodiment, the antenna device 332 may include a plurality of dipole antennas 610. In this case, the first communication circuit 620 and the second communication circuit 630 may be connected in parallel with the plurality of dipole antennas 610, respectively.

Referring to FIG. 6A, according to various embodiments, the processor 310 may control connection by using a first switch 641 disposed between the first antenna element 611 and the first communication circuit 620. For example, the processor 310 may allow the first transmission unit 621 or the first reception unit 622 to be optionally connected to the first antenna element 611 by using the first switch 641.

According to various embodiments, the processor 310 may control connection by using a second switch 642 disposed between the second antenna element 612 and the second communication circuit 630. For example, the processor 310 may allow the second transmission unit 631 or the second reception unit 632 to be optionally connected to the second antenna element 612 by using the second switch 642. According to an embodiment, the first switch 641 and/or the second switch 642 may include an SPDT switch having a low insertion loss and a high isolation.

According to various embodiments, the processor 310 may connect the first transmission unit 621 and the first antenna element 611 by using the first switch 641 so as to transmit a designated signal, and may connect the second antenna element 612 and the second reception unit 632 by using the second switch 642, so as to acquire, via the second antenna element 612, the designated signal transmitted via the first antenna element 611.

Referring to FIG. 6B, according to various embodiments of the disclosure, the first communication circuit 620 may be permanently connected to the first antenna element 611. For example, the first transmission unit 621 may be connected to the first antenna element 611 via a first wiring, and the first reception unit 622 may be connected to the first antenna element 611 via a second wiring. According to an embodiment, the first communication circuit 620 may include a first SPST switch 651 at a point of about 214 of the first wiring connecting the first transmission unit 621 and the first antenna element 611. The first communication circuit 620 may include a second SPST switch 652 at a point of about 214 of the second wiring connecting the first reception unit 622 and the first antenna element 611. According to various embodiments, each of the first SPST switch 651 and the second SPST switch 652 may be configured to be connected to ground. According to an embodiment, the processor 310 may allow one of the first transmission unit 621 or the first reception unit 622 to be optionally connected to the first antenna element 611 by using the first SPST switch 651 and/or the second SPST switch 652. For example, when switching between the first SPST switch 651 and the ground is on, the connection between the first transmission unit 621 and the first antenna element 611 may appear to be open, and when switching between the first SPST switch 651 and the ground is off, the connection between the first transmission unit 621 and the first antenna element 611 may appear to be a short circuit.

According to various embodiments, the second communication circuit 630 may be permanently connected to the second antenna element 612. For example, the second transmission unit 631 may be connected to the second antenna element 612 via a third wiring, and the second reception unit 632 may be connected to the second antenna element 612 via a fourth wiring. According to an embodiment, the second communication circuit 630 may include a third SPST switch 653 at a point of about $\lambda/4$ of the third wiring connecting the second transmission unit 631 and the second antenna element 612. The second communication circuit 630 may include a fourth SPST switch 654 at a point of about 214 of the fourth wiring connecting the second reception unit 632 and the second antenna element 612. According to various embodiments, each of the third SPST switch 653 and the fourth SPST switch 654 may be configured to be connected to ground. According to an embodiment, the processor 310 may allow one of the second transmission unit 631 or the second reception unit 632 to be optionally connected to the second antenna element 612 by using the third SPST switch 653 and/or the fourth SPST switch 654.

According to various embodiments, the processor 310 may control only the first transmission unit 621 to be connected to the first antenna element 611 by using the second SPST switch 652, and may transfer a designated signal to the first antenna element 611 via the first transmission unit 621. The processor 310 may control only the second reception unit 632 to be connected to the second antenna element 612 by using the third SPST switch 553, and may acquire the designated signal from the second antenna element 612 via the second reception unit 632.

According to various embodiments, the processor 310 may be configured to check a state of not only the first communication circuit 620 and the second communication circuit 630, but also the processor 310, the IFIC 320, the RFIC 331 or a combination thereof, based at least on a difference between the designated signal and the designated signal acquired via the second antenna element 612. For example, the difference between the designated signal and the designated signal acquired via the second antenna element may include at least one of a magnitude difference, a phase difference, or a frequency difference. In some embodiments, the processor 310 may perform calibration based on the state of the first communication circuit 620, the second communication circuit 630, the processor 310, the IFIC 320, the RFIC 331, or the combination thereof, or may check whether there is abnormality in the first communication circuit 620, the second communication circuit 630, the processor 310, the IFIC 320, the RFIC 331, or the combination thereof.

According to an embodiment, the first communication circuit 620 and the second communication circuit 630 may have designated isolation characteristics. For example, a designated isolation characteristic may be provided according to a coupling factor between the first antenna element 611 and the second antenna element 612. For example, the first antenna element 611 and the second antenna element 612 may be coupled with an isolation characteristic of 15 dB to 20 dB.

According to an embodiment, the first reception unit 622 and/or the second reception unit 632 may include at least one attenuator. According to various embodiments, the attenuator may attenuate an input signal by a designated isolation. For example, a signal which is output from the first transmission unit 621 and transferred to the first antenna element 611 may generate an induced current according to a coupling phenomenon to the second antenna element 612. The induced current may be transferred to the second reception unit 632 and may be attenuated according to the designated isolation by at least one attenuator included in the second reception unit 632. The processor 310 may be configured to check a state of the first communication circuit 620 and/or a state of the second communication circuit 630 based on a reception signal attenuated according to the designated isolation. As another example, a signal which is output from the second transmission unit 631 and transferred to the second antenna element 612 may generate an induced current according to the coupling phenomenon to the first antenna element 611. The induced current may be transferred to the first reception unit 622 and may be attenuated according to the designated isolation by at least one attenuator included in the first reception unit 622.

FIG. 7 is a flowchart illustrating a method for checking the performance of a communication circuit according to an embodiment of the disclosure.

Referring to FIG. 7, in operation 710, the processor 310 may output a designated transmission signal via at least one antenna by using a first transmission circuit.

According to various embodiments, the RFIC 331 may include a first communication circuit including a first transmission circuit (e.g., the transmission circuit 440 of FIG. 4A) and a first reception circuit which are electrically connected to a first feeding unit, and a second communication circuit including a second transmission circuit and a second reception circuit (e.g., the reception circuit 450 of FIG. 4A) which are electrically connected to a second feeding unit.

According to various embodiments, the antenna device (e.g., the antenna device 332 of FIG. 3) may include at least one antenna (e.g., the antenna 410 of FIG. 4A). According to various embodiments, the antenna may include the first feeding unit (e.g., the first feeding unit 420 of FIG. 4A) that connects the first transmission circuit, the second feeding unit (e.g., the second feeding unit 430 of FIG. 4A) that connects the second reception circuit, and a patch antenna element. The processor 310 may transfer the designated transmission signal to at least one antenna via the first feeding unit by using the transmission circuit.

According to various embodiments, the first feeding unit and the second feeding unit may be electrically connected to a patch antenna element within the antenna. According to some embodiments, the first feeding unit and the second feeding unit may be optionally connected to the patch antenna element by using a switch.

In operation 720, the processor 310 may acquire a reception signal, which is the designated transmission signal having been attenuated according to a designated isolation, via at least one antenna by using the second reception circuit.

According to various embodiments, the second feeding unit may have a designated isolation for a signal that is input to the first feeding unit. For example, the signal that is input to the first feeding unit may be attenuated by a predetermined amount using a coupler, an attenuator, or an isolator connected to the first feeding unit and the second feeding unit, and then the attenuated signal may be transferred to the second feeding unit. For example, the processor 310 may transfer the designated transmission signal transferred from the transmission circuit to the reception circuit via the coupler, the attenuator, or the isolator within at least one antenna.

According to an embodiment, the antenna may include a first switch (e.g., the first switch 411 of FIG. 4B), an attenuator (e.g., the attenuator 412 of FIG. 4B), and a second switch (e.g., the second switch 413 of FIG. 4B). According to various embodiments, the first switch may generate a path so that a signal that is input to the first feeding unit 420 is transferred to one of the patch antenna element or the attenuator. According to various embodiments, the second switch may generate a path so that one of a signal that is input via the patch antenna element or a signal transferred via the attenuator is transferred to the second feeding unit 430. According to an embodiment, the processor 310 may control the first switch so that the designated transmission signal is transferred to the attenuator via the first feeding unit, and may control the second switch so that the attenuated reception signal is transferred to the second feeding unit via the attenuator.

In operation 730, the processor 310 may check a state of the first transmission circuit, the second reception circuit, the processor 310, the IFIC 320, the RFIC 331, or a combination thereof based at least on a difference between the designated transmission signal and the reception signal. For example, the processor 310 may check the state of the first transmission circuit, the second reception circuit, the processor 310, the IFIC 320, the RFIC 331, or the combination thereof based at least on one of a frequency difference, a phase difference, or a magnitude difference between the designated transmission signal and the reception signal. In some embodiments, the processor 310 may perform calibration based on the state of the first transmission circuit, the second reception circuit, the processor 310, the IFIC 320, the RFIC 331, or the combination thereof, or may check whether there is abnormality in the first transmission circuit, the second reception circuit, the processor 310, the IFIC 320, the RFIC 331, or the combination thereof.

Figure 8:
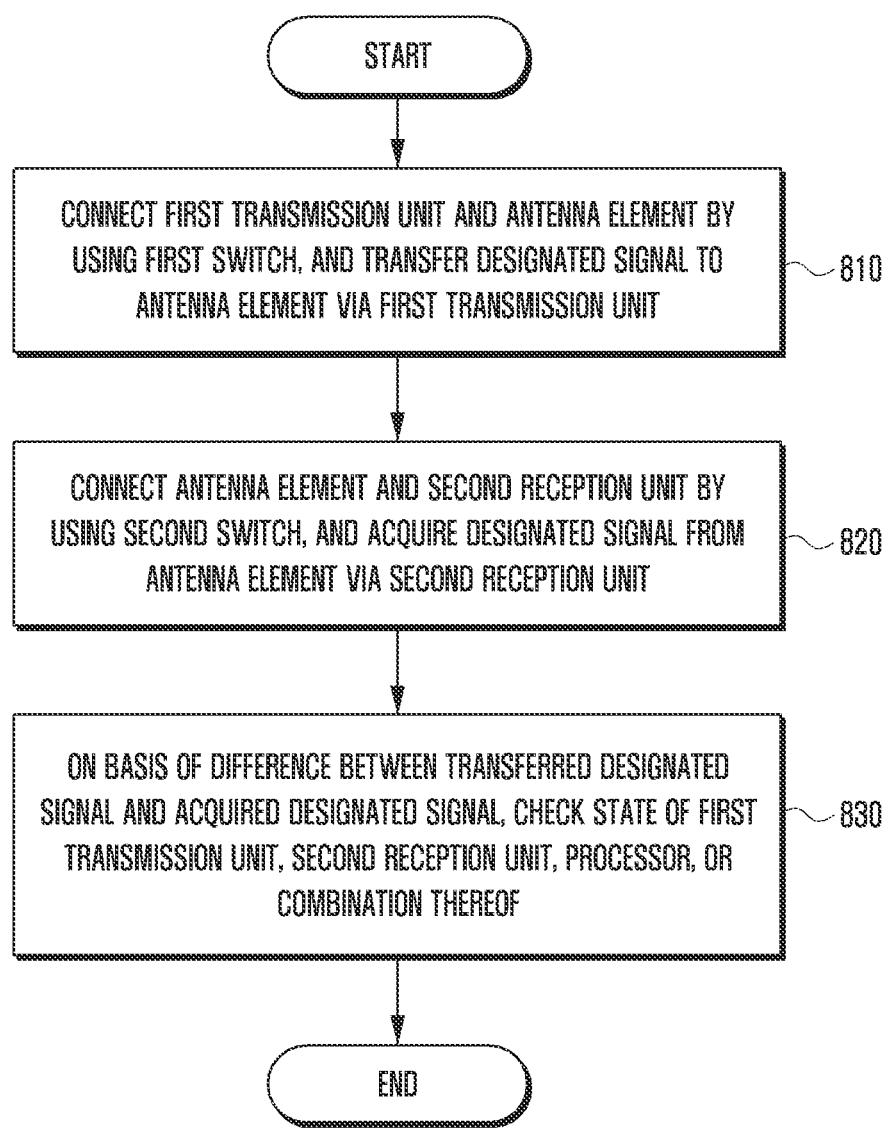
FIG. 8 is a flowchart illustrating a method for checking the performance of a communication circuit according to an embodiment of the disclosure.

FIG. 8 is a flowchart illustrating a method for checking the performance of a communication circuit according to an embodiment of the disclosure.

Referring to FIG. 8, in operation 810, the processor 310 may connect a first transmission unit and an antenna element by using a first switch, and may transfer a designated signal to the antenna element via the first transmission unit.

According to various embodiments, the antenna element (e.g., the antenna element 510 of FIG. 5A or 5B) may include a first feeding unit (e.g., the first feeding unit 511 of FIG. 5A or 5B) and a second feeding unit (e.g., the second feeding unit 512 of FIG. 5A or 5B). According to an embodiment, a first communication circuit (e.g., the first communication circuit 520 of FIG. 5A or B) is electrically connected to the first feeding unit, and a second communication circuit (e.g., the second communication circuit 530 of FIG. 5A or 5B) may be electrically connected to the second feeding unit.

According to various embodiments, the processor 310 may control connection by using a first switch (e.g., the first switch 541 of FIG. 5A) disposed in at least a partial space between the antenna element and the first communication circuit. For example, the processor 310 may allow one of the first transmission unit (e.g., the first transmission unit 521 of FIG. 5B) or the first reception unit (e.g., the first reception unit 522 of FIG. 5B) to be optionally connected to the first feeding unit by using the first switch. For example, the processor 310 may allow the first transmission unit and the antenna element to be connected using the first switch, and may allow the designated signal to be transferred to the antenna element via the first feeding unit and the first transmission unit.

In operation 820, the processor 310 may connect the antenna element and a second reception unit by using the second switch, and may acquire the designated signal from the antenna element via the second reception unit.

According to various embodiments, the processor 310 may control connection by using the second switch (e.g., the second switch 542 of FIG. 5A) disposed in at least a partial space between the antenna element and the second communication circuit. For example, the processor 310 may allow the second transmission unit (e.g., the second transmission unit 531 of FIG. 5B) or the second reception unit (e.g., the second reception unit 532 of FIG. 5B) to be optionally connected to the second feeding unit by using the second switch. For example, the processor 310 may allow the second reception unit and the antenna element to be connected using the second switch, and may allow the signal transferred from the antenna element to be acquired via the second feeding unit and the second reception unit.

In operation 830, the processor 310 may check a state of the first transmission unit, the second reception unit, the processor 310, the IFIC 320, the RFIC 331, or a combination thereof based at least on a difference between the transferred designated signal and the acquired designated signal. For example, the processor 310 may check the state of the first transmission unit, the second reception unit, the processor 310, the IFIC 320, the RFIC 331, or the combination thereof based at least on a frequency difference, a phase difference, or a magnitude difference between the transferred designated signal and the acquired designated signal. In some embodiments, the processor 310 may perform calibration based on the state of the first transmission unit, the second reception unit, the processor 310, the IFIC 320, the RFIC 331, or the combination thereof, or may check whether there is abnormality in the first transmission unit, the second reception unit, the processor 310, the IFIC 320, the RFIC 331, or the combination thereof.

According to an embodiment, the first communication circuit and the second communication circuit may show designated isolation characteristics. For example, because a predetermined part of the signal transmitted from the first communication circuit is attenuated via the antenna element, a designated isolation characteristic may be shown between the first communication circuit and the second communication. As another example, the first reception unit and/or the second reception unit may include at least one attenuator. According to various embodiments, the attenuator may attenuate an input signal by a designated isolation.

Figure 9:
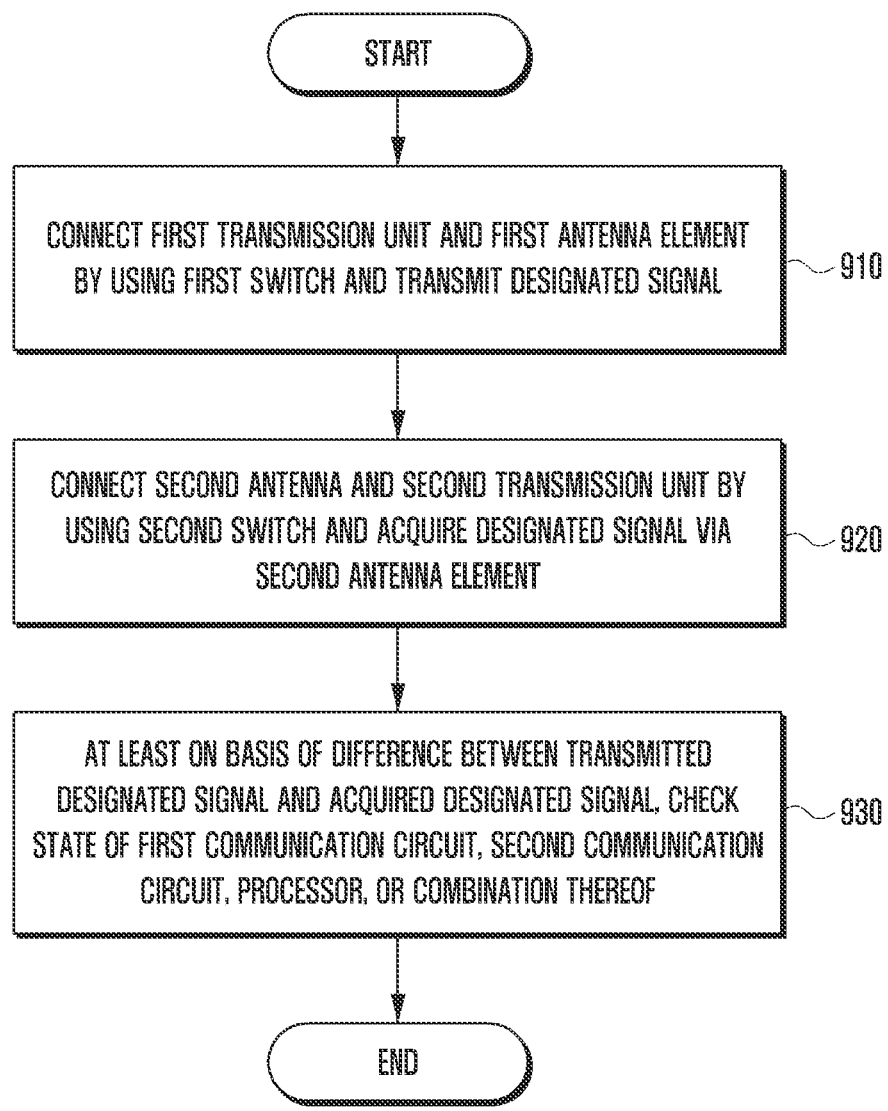
FIG. 9 is a flowchart illustrating a method for checking the performance of a communication circuit according to an embodiment of the disclosure.

FIG. 9 is a flowchart illustrating a method for checking the performance of a communication circuit according to an embodiment of the disclosure.

Referring to FIG. 9, in operation 910, the processor 310 may connect a first transmission unit and a first antenna element by using a first switch so as to transfer a designated signal.

According to various embodiments, an antenna device may include a first antenna element (e.g., the first antenna element 611 of FIG. 6A or 6B) that communicates a first signal and a second antenna element (e.g., the second antenna element 612 of FIG. 6A or 6B) that communicates a second signal. According to an embodiment, the first antenna element and the second antenna element may include a dipole antenna (e.g., the dipole antenna 610 of FIG. 6A or 6B).

According to various embodiments, the processor 310 may control connection by using a first switch (e.g., the first switch 641 of FIG. 6A) disposed between the first antenna element and a first communication circuit (e.g., the first communication circuit 620 of FIG. 6A). For example, the processor 310 may allow the first transmission unit (e.g., the first transmission unit 621 of FIG. 6A) or a first reception unit (e.g., the first reception unit 622 of FIG. 6A) to be optionally connected with the first antenna element by using the first switch. For example, the processor 310 may connect the first transmission unit and the first antenna element by using the first switch, and may allow the designated signal to be transferred to the antenna element via the first transmission unit.

In operation 920, the processor 310 may connect a second antenna and a second transmission unit by using a second switch so as to acquire, via the second antenna element, the designated signal transmitted via the first antenna element.

According to various embodiments, the processor 310 may control connection by using a second switch (e.g., the second switch 642 of FIG. 6A) disposed between the second antenna element and a second communication circuit (e.g., the second communication circuit 630 of FIG. 6A). For example, the processor 310 may allow the second transmission unit (e.g., the second transmission unit 631 of FIG. 6A) or a second reception unit (e.g., the second reception unit 632 of FIG. 6A) to be optionally connected with the second antenna element by using the second switch. For example, the processor 310 may connect the second reception unit and the antenna element by using the second switch, and may allow the signal transferred from the antenna element to be acquired via the second reception unit.

In operation 930, the processor 310 may check a state of the first communication circuit, the second communication circuit, the processor 310, the IFIC 320, the RFIC 331, or a combination thereof based at least on a difference between the transmitted designated signal and the designated signal acquired via the second antenna element. For example, the processor 310 may check the state of the first communication circuit, the second communication circuit, the processor 310, the IFIC 320, the RFIC 331, or the combination thereof based at least on a frequency difference, a phase difference, or a magnitude difference between the transmitted designated signal and the acquired designated signal. In some embodiments, the processor 310 may perform calibration based on the state of the first communication circuit, the second communication circuit, the processor 310, the IFIC 320, the RFIC 331, or the combination thereof, or may check whether there is abnormality in the first communication circuit, the second communication circuit, the processor 310, the IFIC 320, the RFIC 331, or the combination thereof.

According to an embodiment, the first communication circuit and the second communication circuit may show designated isolation characteristics. For example, because a predetermined part of the signal transmitted from the first communication circuit is attenuated via the antenna element, a designated isolation characteristic may be shown between the first communication circuit and the second communication. As another example, the first reception unit and/or the second reception unit may include at least one attenuator. According to various embodiments, the attenuator may attenuate an input signal by a designated isolation.

An electronic device according to various embodiments disclosed herein may be various types of devices. The electronic devices may include, for example, a portable communication device (e.g., a smart phone), a computer device, a portable multimedia device, a portable medical device, a camera, a wearable device, or a home appliance. According to an embodiment, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. In this document, each of phrases, such as "A or B", "at least one of A and B", "at least one of A or B," "A, B or C," "at least one of A, B and C," and "at least one of A, B, or C", may include any one of the items listed together in a corresponding phrase, or all possible combination thereof. As used herein, such terms as "1st", "2nd", "first", or "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", or "connected with", it means that the element may be coupled with the other element directly (e.g., wiredly), wirelessly, or via a third element.

As used herein, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it. This allows the machine to be operated to perform at least one function according to the invoked at least one instruction. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more components of the above-described components or operations may be omitted, or one or more other components or operations may be added. Alternatively or additionally, a plurality of components (e.g., modules or programs) may be integrated into a single component. In such a case, according to various embodiments, the integrated component may perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown described with reference to various embodiments thereof, it will be understood by those skilled in the art that various changes in form and details may be made therein without departing from the spirit and scope of the disclosure as defined by the appended claims and their equivalents.

What is claimed is:

1. A portable communication device comprising:
   one antenna comprising a first part of the one antenna and a second part of the one antenna, the first part of the one antenna being different from the second part of the one antenna but physically part of the same one antenna;
   a first communication circuit comprising a first transmission circuit and a first reception circuit;
   a second communication circuit comprising a second transmission circuit and a second reception circuit;
   a first switch circuit configured to form a first signal path between the first part of the one antenna and one of the first transmission circuit or the first reception circuit;
   a second switch circuit configured to form a second signal path between the second part of the one antenna and one of the second transmission circuit or the second reception circuit;
   a processor; and
   a memory operatively connected to the processor,
   wherein the memory is configured to store instructions that, when executed, cause the processor to:

control the first switch circuit to form the first signal path between the first transmission circuit and the first part of the one antenna, to transmit a first signal, and while transmitting the first signal, control the second switch circuit to form the second signal path between the second reception circuit and the second part of the one antenna, to receive a second signal, corresponding to the first signal being transmitted, via the second part of the one antenna.

2. The portable communication device of claim 1,
wherein the first part of the one antenna corresponds to a first feeding location on the one antenna for transmitting a signal having a horizontal polarization, and
wherein the second part of the one antenna corresponds to a second feeding location on the one antenna for transmitting a signal having a vertical polarization.

3. The portable communication device of claim 1, further comprising:
a printed circuit board comprising a first surface and a second surface facing opposite to the first surface,
wherein the one antenna is disposed on the first surface, and
wherein the first communication circuit and the second communication circuit are disposed on the second surface.

4. The portable communication device of claim 3, further comprising:
another printed circuit board,
wherein the processor is disposed on the other printed circuit board.

5. The portable communication device of claim 3,
wherein the one antenna is included in an antenna array comprising a plurality of antennas, and
wherein the antenna array is disposed on the first surface.

6. The portable communication device of claim 1, wherein the instructions, when executed, further cause the processor to, based on the received second signal, determine a state of at least a part of a signal path comprising the first transmission circuit, the one antenna, and the second reception circuit.

7. The portable communication device of claim 6, wherein the instructions, when executed, further cause the processor to perform calibration related to the at least the part of the signal path based on the determined state.

8. The portable communication device of claim 6, wherein the instructions, when executed, further cause the processor to determine the state, when at least a part of the received second signal is attenuated by a designated degree or more in comparison to the transmitted first signal.

9. The portable communication device of claim 6, wherein the instructions, when executed, further cause the processor to determine the state based on at least one of a magnitude difference, phase difference, or frequency difference between the transmitted first signal and the received second signal.

10. The portable communication device of claim 1, further comprising:
a first feeding unit connected to the first part of the one antenna among; and
a second feeding unit connected to the second part of the one antenna,
wherein the first switch circuit is configured form the first signal path via the first feeding unit, and
wherein the second switch circuit is configured form the second signal path via the second feeding unit.

11. The portable communication device of claim 10, wherein the first switch circuit comprises:
a first wiring configured to connect the first feeding unit and the first transmission circuit;
a second wiring configured to connect the first feeding unit and the first reception circuit;
a first switch configured to electrically connect or disconnect a ground and a point on the first wiring having a length of 214 from the first feeding unit; and
a second switch configured to electrically connect or disconnect a ground and a point on the second wiring having a length of 214 from the first feeding unit.

12. The portable communication device of claim 11, wherein the instructions, when executed, further cause the processor to:
electrically disconnect the first wiring and the ground via the first switch, and
electrically connect the second wiring with the ground via the second switch, so as to transfer the transmitted first signal to the first feeding unit from the first transmission circuit.

13. The portable communication device of claim 10, wherein the second switch circuit comprises:
a third wiring configured to connect the second feeding unit and the second transmission circuit;
a fourth wiring configured to connect the second feeding unit and the second reception circuit;
a third switch configured to electrically connect or disconnect a ground and a point on the third wiring having a length of 214 from the second feeding unit; and
a fourth switch configured to electrically connect or disconnect a ground and a point on the fourth wiring having a length of $\lambda/4$ from the second feeding unit.

14. The portable communication device of claim 13, wherein the instructions, when executed, further cause the processor to:
electrically connect the third wiring and the ground via the third switch, and
electrically disconnect the fourth wiring and the ground via the fourth switch, so as to transfer the received second signal to the second reception circuit from the second feeding unit.

15. The portable communication device of claim 1,
wherein the first communication circuit is configured to support a horizontal polarization component of a signal transmitted or received via the one antenna, and
wherein the second communication circuit is configured to support a vertical polarization component of a signal transmitted or received via the one antenna.

16. The portable communication device of claim 1, wherein the instructions, when executed, further cause the processor to control to transmit a radio frequency (RF) signal of a frequency band designated to be used for fifth generation (5G) network communication to the one antenna, via the first transmission circuit.

17. The portable communication device of claim 16, wherein the frequency band is 6 GHz or higher.

18. The portable communication device of claim 1, wherein the one antenna is included in an antenna array comprising a plurality of antennas.

19. The portable communication device of claim 1, wherein the instructions, when executed, further cause the processor to, based on at least a part of the transmitted first signal, perform calibration related to at least a part of a signal path comprising the processor, the first transmission circuit, the one antenna, and the second reception circuit.

20. The portable communication device of claim 1,
wherein the first transmission circuit is configured to convert a baseband signal from the processor into a radio frequency band signal for the first switch circuit,
wherein the first reception circuit is configured to convert a radio frequency band signal from the first switch circuit into a baseband signal for the processor,
wherein the second transmission circuit is configured to convert a baseband signal from the processor into a radio frequency band signal for the second switch circuit, and
wherein the second reception circuit is configured to convert a radio frequency band signal from the second switch circuit into a baseband signal for the processor.

21. The portable communication device of claim 1, further comprising:
an intermediate frequency integrated circuit (IFIC) configured to:
convert a baseband signal from the processor into an intermediate frequency band signal for at least one of the first transmission circuit or the second transmission circuit, and
convert an intermediate frequency band signal from at least one of the first transmission circuit or the second transmission circuit into a baseband signal for the processor,
wherein the first transmission circuit is configured to convert the intermediate frequency band signal from the IFIC into a radio frequency band signal for the first switch circuit,
wherein the first reception circuit is configured to convert a radio frequency band signal from the first switch circuit into the intermediate frequency band signal for the IFIC,
wherein the second transmission circuit is configured to convert the intermediate frequency band signal from the IFIC into a radio frequency band signal for the second switch circuit, and
wherein the second reception circuit is configured to convert a radio frequency band signal from the second switch circuit into the intermediate frequency band signal for the IFIC.

22. The portable communication device of claim 1, wherein the instructions, when executed, further cause the processor to:
control the first switch circuit to form the first signal path between the first transmission circuit and the first part of the one antenna, to transmit a third signal via the first part of the one antenna, and
while transmitting the third signal, controlling the second switch circuit to form the second signal path between the second transmission circuit and the second part of the one antenna, to transmit a fourth signal via the second part of the one antenna.

* * * * *